United States Patent [19]

Suzuki et al.

[11] Patent Number: 5,000,573
[45] Date of Patent: Mar. 19, 1991

[54] METHOD OF ALIGNMENT WITH THE USE OF DIFFRACTION GRATINGS AND AN APPARATUS THEREFOR

[75] Inventors: Masanori Suzuki, Kanagawa; Makoto Iki, Fukuoka; Atsunobu Une, Kanagawa, all of Japan

[73] Assignee: Nippon Telegraph and Telephone Corporation, Tokyo, Japan

[21] Appl. No.: 492,259

[22] Filed: Mar. 12, 1990

Related U.S. Application Data

[63] Continuation of Ser. No. 300,707, Jan. 23, 1989, abandoned, which is a continuation of Ser. No. 47,050, May 6, 1987, abandoned.

[30] Foreign Application Priority Data

| May 7, 1986 | [JP] | Japan | 61-104186 |
| May 23, 1986 | [JP] | Japan | 61-118644 |
| Aug. 1, 1986 | [JP] | Japan | 61-181345 |
| Jan. 13, 1987 | [JP] | Japan | 62-4132 |

[51] Int. Cl.$^5$ .............................................. G01B 9/02
[52] U.S. Cl. .................. 356/363; 356/349; 356/400
[58] Field of Search ............... 356/349, 356, 363, 400

[56] References Cited

U.S. PATENT DOCUMENTS 4,710,026 12/1987 Magome et al. .................... 356/400

FOREIGN PATENT DOCUMENTS 151032 1/1985 European Pat. Off. .

OTHER PUBLICATIONS

J. Vac. Sci. Technol., 19(4), Nov./Dec. 1981, pp. 1214–1218.
Precision Engineering, Jul. 1983, vol. 5, No. 3, pp. 111–114.

Primary Examiner—Samuel Turner
Attorney, Agent, or Firm—Blakely, Sokoloff, Taylor & Zaffman

[57] ABSTRACT

In a method of measuring/adjusting a relative displacement of objects using diffraction gratings, two monochromatic beams each having slightly different frequencies are synthesized to cause optical heterodyne interference so as to generate two beat signals. One of the beat signals is used as a reference signal. The other is used as a first interference beat signal generated by emitting the two monochromatic beams on a first diffraction grating arranged on a first object and by synthesizing two diffracted beams generated from the first diffraction grating by the above emission to cause optical heterodyne interference. A phase difference between the reference beat signal and the interference beat signal is then detected. Finally, the relative displacement is measured/adjusted in accordance with the phase difference.

20 Claims, 12 Drawing Sheets

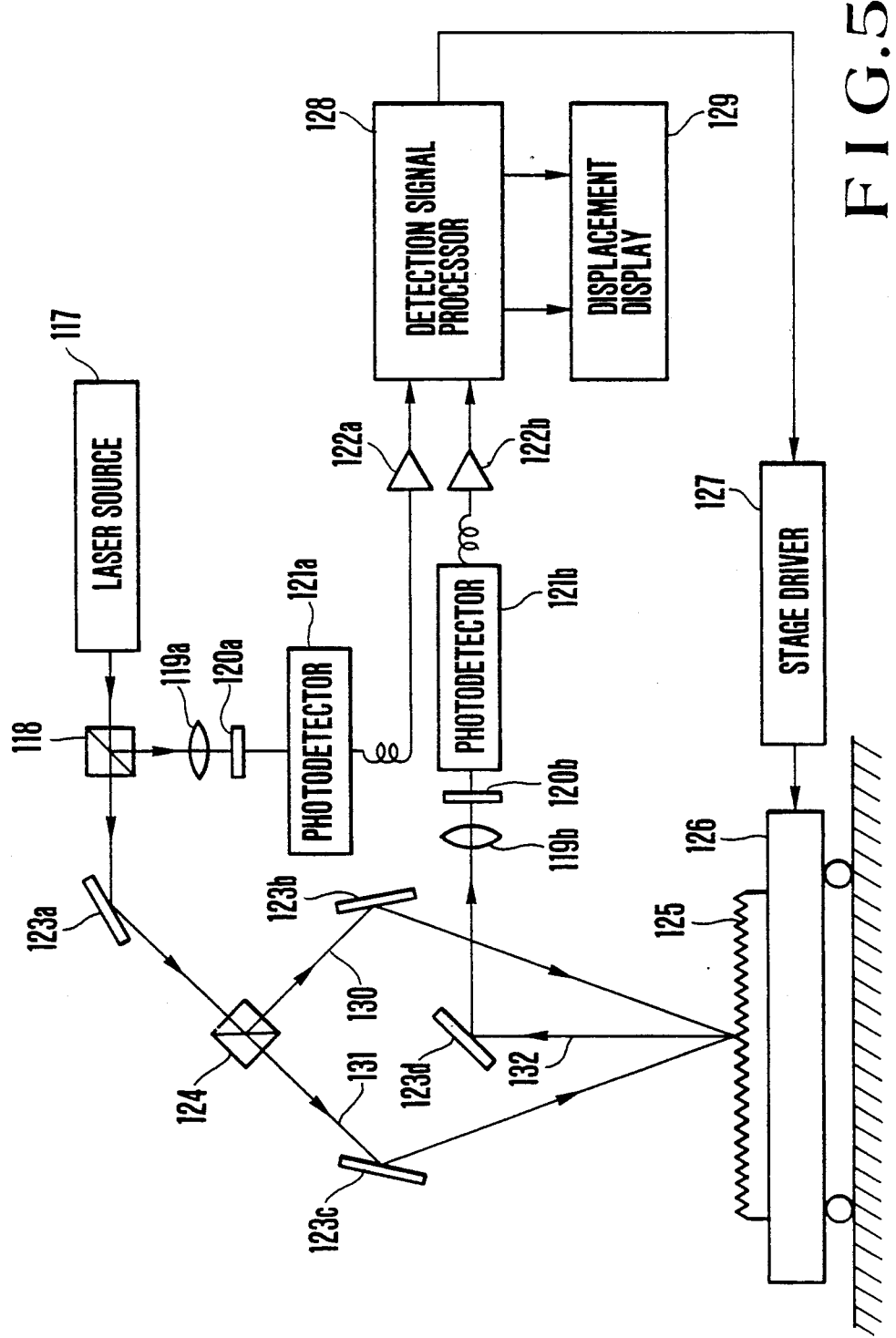
F I G. 5

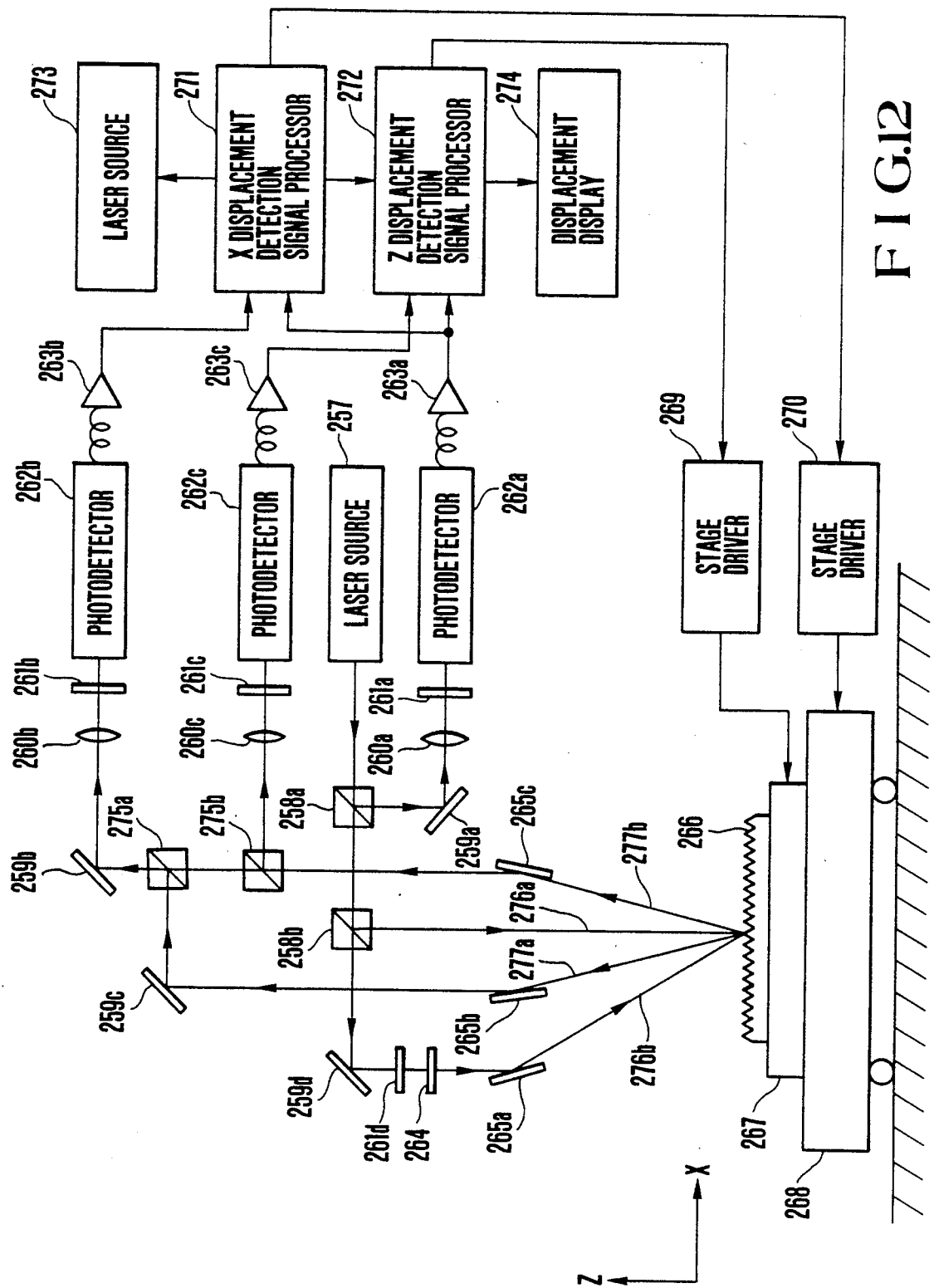
F I G. 12

METHOD OF ALIGNMENT WITH THE USE OF DIFFRACTION GRATINGS AND AN APPARATUS THEREFOR

This is a continuation of application Ser. No. 300,707 filed Jan. 23, 1989, now abandoned, which is a continuation of application Ser. No. 047,050 filed May 6, 1987, now abandoned.

BACKGROUND OF THE INVENTION

The present invention relates to a method of measuring/adjusting a relative displacement of objects using diffraction gratings, which can be suitably applied to an exposure apparatus, a pattern evaluating apparatus, and the like for manufacturing, e.g., semiconductor ICs and LSIs.

A method of measuring/adjusting a displacement of an object using a diffraction grating is well known as an effective method of performing mask alignment and setting a gap between the mask and a wafer with high precision. For example, such a method is disclosed in European Patent Publication No. 0151032A2 (Aug. 7, 1985). According to this method, a laser beam is emitted onto diffraction grating marks respectively formed on a wafer and a mask to generate diffracted beams, thereby performing alignment and setting gap in accordance with changes in intensity of the diffracted beams. In this method, a pitch of a wafer-side deviation detecting diffraction grating mark is set to be an integer multiple of that of a mask-side deviation detecting diffraction grating mark, so that a gap variation less adversely affects signals.

However, since an influence of the gap fluctuation cannot be completely eliminated, alignment must be performed at a specific gap value. In addition, during exposure, the mask-side deviation detecting diffraction grating mark is transferred onto the wafer-side deviation detecting diffraction grating mark, the same mark cannot be continuously used in the next process. Therefore, a new wafer-side deviation detecting diffraction grating mark is necessary in each process, and a wide mark updating region is required on the wafer, resulting in a narrow LSI pattern region. Furthermore, since a peak value of an envelope wave of interference waves is searched from a gap detection signal to set a gap, a detector therefor becomes complex, and when a plurality of peak values appear in the envelope wave due to, e.g., multiple interference between the mask and the wafer, a long period of time is required for setting a gap.

SUMMARY OF THE INVENTION

It is, therefore, a principal object of the present invention to provide a method of measuring/adjusting a relative position of objects using diffraction gratings capable of measuring/controlling a relative displacement of objects regardless of a positional relationship according to absolute coordinates and an apparatus therefor.

It is another object of the present invention to provide a method of measuring/adjusting a position of an object using diffraction gratings capable of improving a detection resolution than that obtained by versatile diffraction gratings and an apparatus therefor.

It is still another object of the present invention to provide a method capable of extremely easily aligning a position of an object without precisely determining an optical path length of an incident beam and an apparatus therefor.

It is still another object of the present invention to provide a method capable of measuring/adjusting a micro-displacement of an object with high precision and an apparatus therefor.

It is still another object of the present invention to provide a method capable of measuring/controlling a micro-displacement with high precision regardless of variations in luminance in a diffracted beam and an apparatus therefor.

It is still another object of the present invention to provide a method capable of performing two- or three-dimensional relative alignment between two objects easily and regardless of a positional relationship according to absolute coordinates and an apparatus therefor.

It is still another object of the present invention to provide a method capable of easily displacing an object along two directions and with high precision and an apparatus therefor.

It is still another object of the present invention to provide a method capable of accurately aligning two objects in a measurement range even if the objects have poor flatness and an apparatus therefor.

It is still another object of the present invention to provide a method in which the same diffraction grating pattern can be used in a plurality of steps during, e.g., manufacture of a semiconductor and an apparatus therefor.

In order to achieve the above objects, the present invention utilizes a technique in which a monochromatic beam having two wavelengths with frequencies slightly different from each other is synthesized to cause optical heterodyne interference to generate at least two beat signals, and a phase difference between the beat signals is measured. In this case, according to the present invention, a monochromatic beam is emitted onto a diffraction grating arranged on an object to obtain a diffracted beam, thereby forming at least one of the beat signals therefrom.

Therefore, according to an aspect of the present invention, there is provided a method of measuring/adjusting a relative displacement of objects using diffraction gratings, comprising generating at least two beat signals by synthesizing two monochromatic beams each having slightly different frequencies so as to cause optical heterodyne interference, a first one of the beat signals being used as a reference signal, and a second one of the beat signals being used as a first interference beat signal generated by emitting the two monochromatic beams onto a first diffraction grating arranged on a first object and by synthesizing two diffracted beams generated from the first diffraction grating by emission of the two monochromatic beams to cause the optical heterodyne interference, detecting a phase difference between the reference beat signal and the interference beat signal, and measuring/adjusting the relative displacement of the objects in accordance with the phase difference.

In addition, according to another aspect of the present invention, there is provided an apparatus for measuring/adjusting a relative displacement of objects using diffraction gratings, comprising a first diffraction grating arranged on a first object, a laser source for generating two monochromatic beams each having slightly different frequencies, means for generating a reference beat signal generated by optical heterodyne interference in accordance with the two monochromatic beams, means for emitting the two monochromatic beams on the first diffraction grating, means for synthesizing at least two diffracted beams obtained from the first diffraction grating and for generating a first interference beat signal by the optical heterodyne interference, and means for detecting a phase difference between the reference beat signal and the interference beat signal.

BRIEF DESCRIPTION OF THE DRAWINGS

FIG. 5 is a schematic view showing an arrangement of still another embodiment of the present invention;

FIG. 12 is a schematic view showing an arrangement of still another embodiment of the present invention;

DETAILED DESCRIPTION OF THE PREFERRED EMBODIMENTS

Figure 1:
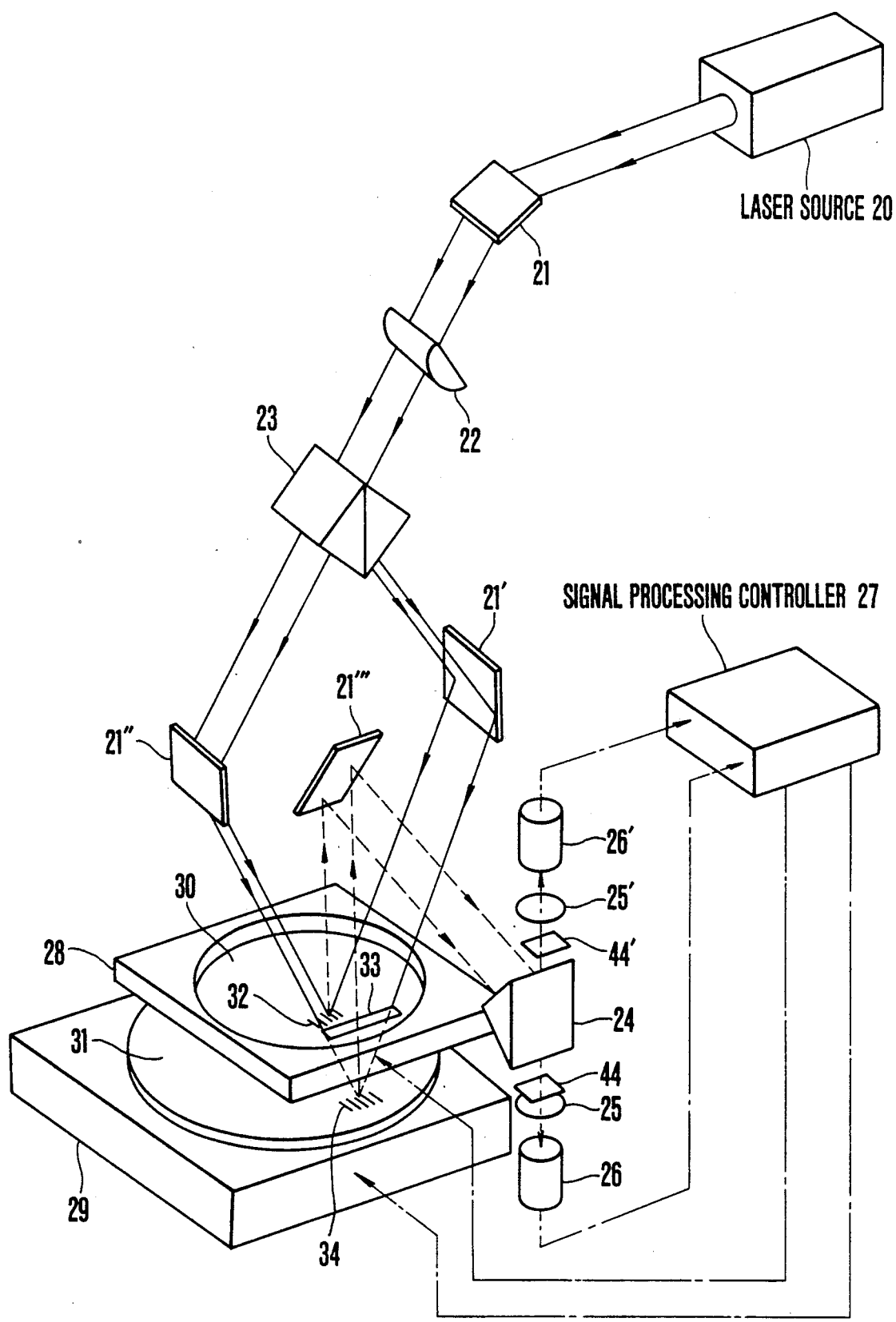
FIG. 1 is a schematic perspective view showing an arrangement of an embodiment of an apparatus for measuring/adjusting a relative position of objects using diffraction gratings according to the present invention.

FIG. 1 shows a schematic arrangement of an embodiment of an apparatus for measuring/adjusting a relative position of objects using diffraction gratings according to the present invention, i.e., an X-ray exposure apparatus for manufacturing semiconductor ICs and LSIs. In FIG. 1, reference numeral 20 denotes a two-wave orthogonally polarized laser source (light source) for emitting a beam having two wavelengths with frequencies slightly different from each other and having directions of plane of polarization orthogonal to each other, and reference numerals 21, 21', 21'', and 21''' denote incident mirrors. Angles of mirrors 21' and 21'' can be adjustable. Reference numeral 22 denotes a cylindrical lens; 23, a polarization beam splitter; 24, a prism-like mirror; 25 and 25', condenser lenses; 26 and 26', photodetectors (first and second detecting means); 27, a signal processing controller (signal processing controlling means); 28, a mask stage; 29, a wafer stage; 30, a mask (first object); 31, a wafer (second object); 32, a reflecting diffraction grating (first diffraction grating); 33, a monochromatic light incident/diffracted light extracting window; 34, a reflecting diffraction grating (second diffraction grating); and 44 and 44', linear polarizers. The monochromatic light incident/diffracted light extracting window 33 is an opening formed in the mask 30 so that an incident beam is directly incident onto the diffraction grating 34 and a diffracted beam is directly extracted therefrom through the window 33. The mask stage 28 and the wafer stage 29 constitute a moving mechanism for moving the mask 30 and the wafer 31 relative to each other. Such a moving mechanism is conventionally known well, and a detailed description thereof will be omitted.

In FIG. 1, a beam emitted from the two-wave orthogonally polarized laser source 20 is converted into an elliptic beam through the mirror 21 and the cylindrical lens 22. The beam is split by the polarization beam splitter 23 into a linearly polarized beam having only horizontal component and a linearly polarized beam having only vertical component, the frequency of the latter linearly polarized beam being slightly different from that of the aforementioned linearly polarized beam. The split beams are incident on the reflecting diffraction gratings 32 and 34 at desired angles through the mirrors 21' and <'' (incident angle adjusting means), respectively. In the case shown in FIG. 1, the reflecting diffraction gratings 32 and 34 are spaced apart from each other along grating line directions in which the gratings are aligned, and are arranged within the same elliptic beam path of the incident beam. Diffraction grating pitches of the reflecting diffraction gratings 32 and 34 are equal to each other. A diffracted beam obtained from the diffraction grating 32 and a diffracted beam obtained from the diffraction grating 34 through the monochromatic light incident/diffracted light extracting window 33 are guided to the photodetectors 26 and 26' respectively through the mirror 21''' (light synthesizing means), the prism-like mirror 24 (light separating means), the condenser lenses 25 and 25', and the linear polarizes 44 and 44', and are processed in the signal processing controller 27 as diffracted beam beat signals. The signal processing controller 27 detects a phase difference between both the beat signals using as a reference beat signal either of the beat signals of the diffracted beams obtained from the reflecting diffraction gratings 32 and 34, and generates a driving signal for moving the mask stage 28 or the wafer stage 29 relative to each other so that the phase difference becomes 0°. Therefore, precise alignment is performed between the mask 30 and the wafer 31 so that a pattern on the mask is exposed at a predetermined position on the wafer with high precision.

Figure 2:
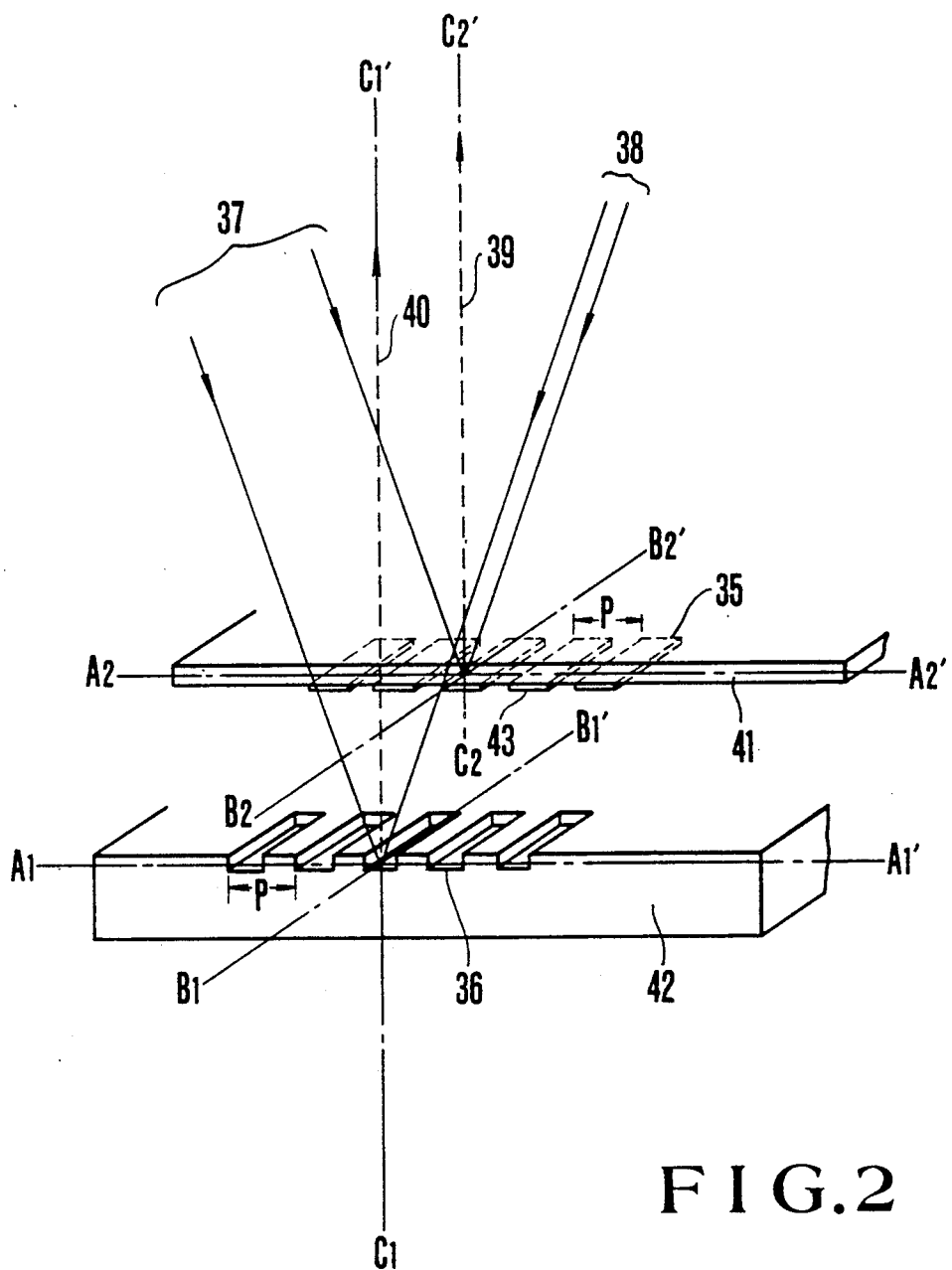
FIG. 2 is an enlarged perspective sectional view of a main part for explaining an operation of the apparatus shown in FIG. 1.

A method of measuring/adjusting a relative position, i.e., in this example, a method of alignment by the apparatus having the above arrangement will be described below with reference to FIG. 2. In FIG. 2, reference numeral 35 denotes a reflecting diffraction grating (first diffraction grating); 36, a reflecting diffraction grating (second diffraction grating); 37 and 38, two incident beams each having frequencies slightly different from each other; 39 and 40, diffracted beams (optical heterodyne interference diffracted beams); 41, a thin transparent film constituting a mask (first object); 42, a wafer; and 43, a thin opaque film. The thin opaque film 43 and the thin transparent film 41 arranged immediately thereon constitute one grating. In FIG. 2, five grating elements are arranged to constitute the first diffraction grating 35. The second diffraction grating 36 is constituted by grating elements consisting of five parallel recesses formed on the wafer 42. $B_1$-$B_1'$ denotes a grating line direction of the second diffraction grating;

$B_2-B_2'$, a grating line direction of the first diffraction grating; $A_1-A_1'$, a grating pitch direction perpendicular to $B_1-B_1'$; $A_2-A_2'$, a grating pitch direction perpendicular to $B_2-B_2'$; $C_1-C_1'$, a direction perpendicular to a grating surface of the diffraction grating 36; and $C_2-C_2'$, a direction perpendicular to a grating surface of the diffraction grating 35. In the case shown in FIG. 2, a distance between gratings, i.e., a pitch of the first and second diffraction gratings 35 and 36 is P, the diffraction grating 35 is offset along the direction $B_1-B_1'$ (grating line direction) so as not to overlap the grating surface of the diffraction grating 36, and the extracting window 33 (not shown in FIG. 2) is formed vertically above the diffraction grating 36. By adjusting the angles of the mirrors 21' and 21", incident directions of the incident beams 37 and 38 are set to be angles of reflected diffracted beams of 1st orders of the diffraction gratings 35 and 36 with respect to the direction $C_1-C_1'$ (or $C_2-C_2'$) perpendicular to the diffraction grating, i.e., $\theta_{-1}=\sin^{-1}(\lambda_1/P)$ and $\theta_{+1}=\sin^{-1}(\lambda_2/P)$, respectively. Each of the incident beams 37 and 38 has wavelengths of $\lambda_1$ and $\lambda_2$. A frequency difference $\Delta f$ is several kHz to several hundred MHz, $\Delta f = C \cdot |1/\lambda_1 - 1/\lambda_2|$ (C represents velocity of light), and $\Delta f << C$, so that $\theta_{-1} = \theta_{+1}$.

Therefore, the beams 37 and 38 incident on the diffraction gratings 35 and 36 are primarily reflectively diffracted and optically synthesized along directions (directions $C_2-C_2'$ and $C_1-C_1'$) perpendicular to the grating surfaces, respectively, by the reflecting diffraction gratings 35 and 36. The synthesized beams are respectively converted into optical heterodyne interference beams 39 and 40. These heterodyne interference diffracted beams 39 and 440 are beams diffracted by the different diffraction gratings 35 and 36, but the incident angles of the incident beams 37 and 38 are symmetrical with respect to the vertical direction of the grating surfaces. Therefore, although the diffraction gratings 35 and 36 are offset from each other along the vertical directions (directions $C_1-C_1'$ and $C_2-C_2'$) and the grating line directions (directios $B_1-B_1'$ and $B_2-B_2'$) respectively, changes in optical path lenghts of the incident beams 37 and 38 to the diffraction gratings 35 and 36 become equal to each other, and a phase difference between the beat signals obtained from the diffracted beams 39 and 40 is not adversely affected by a phase shift of the diffraction gratings 35 and 36 with respect to displacements along the vertical and grating line directions. That is, the phase difference between the beat signals obtained from the diffracted beams 39 and 40 varies in accordance with only special disposition of the diffraction gratings 35 and 36 with respect to the pitch directions (directions $A_2'A_2'$ and $A_1-A_1'$), i.e., a relative deviation. When the diffraction gratings 35 and 36 are aligned straight along the grating line direction (direction $B_1-B_1'$ or $B_2-B_2'$), the phase difference between the beat signals obtained from the diffracted beams 39 and 40 is set to be 0°, thereby completing alignment. Assuming that the relative displacement of the diffraction gratings 35 and 36 with respect to the directions $A_1-A_1'$ or $A_2-A_2$ is $\Delta X$ and the phase difference between the beat signals is $\Delta\phi$, the phase difference $\Delta\phi$ is obtained by the following equation (1):

$$\Delta\phi = 2\pi \cdot \Delta X/(P/2) \qquad (1)$$

Figure 3:
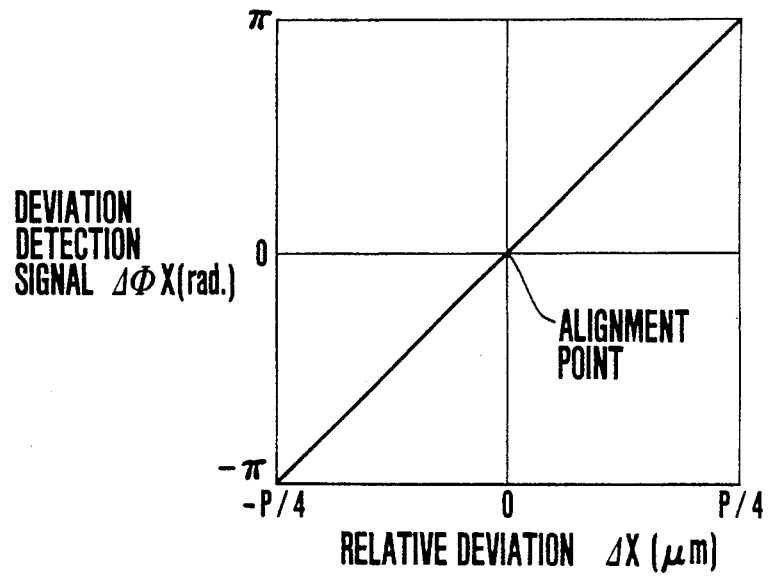
FIG. 3 is a graph of a deviation characteristic showing a relationship between a relative deviation and a phase difference between beat signals.

Therefore, the phase difference $\Delta\phi$ varies in synchronism with a relative displacement of ½ pitch of the diffraction grating. FIG. 3 is a graph showing this relationship. In FIG. 3, the abscissa represents the relative displacement $\Delta X$, and the ordinate represents a deviation detection signal, i.e., the phase difference $\Delta\phi$. As is apparent from the above description, an interval between the transparent film 41 and the wafer 42 can be properly determined.

As described above, according to the apparatus of this embodiment, the first and second diffraction gratings provided for the first and second objects are offset from each other along the grating line directions so as not to overlap each other, so that the optical heterodyne interference diffracted beams obtained from the first and second diffraction gratings can be completely detected independently of each other. In addition, the phase difference between the beat signals obtained from both the diffracted beams corresponding to the relative displacement between the first and second objects is detected directly and stably, and the phase difference is set to be 0°, thereby stably performing precise alignment.

Furthermore, the monochromatic beams incident on the diffraction grating are set in a direction of an nth diffraction angle (n is a positive integer) symmetrical about the direction perpendicular to the grating surface of the diffraction grating, and the first and second diffraction gratings are arranged inside the same spot of the monochromatic beams. Therefore, the phase shift between the diffracted beams due to changes in the optical path of an optical system of the monochromatic beams to the diffraction gratings appear as the same phase shift between the beat signals obtained by the first and second diffraction gratings and are cancelled therewith, so that no influence of the phase shift occurs. Accordingly, since the optical path length of the two beams need not be set with high precision, the optical system can be easily adjusted and the mechanism becomes simple. In addition, a phase shift caused by changes in the optical path length due to microvibration and the like of, e.g., an optical component is also cancelled, so that highly stable phase difference signals can be extracted.

Moreover, according to the present invention, since a single diffracted beam from each diffraction grating is detected, the intensity of the obtained diffracted beam is higher than that obtained by a conventional method in which a double diffracted beam is detected.

Note that the present invention can be applied not only to an apparatus which performs relative alignment of two objects but also to an apparatus which measures a relative micro-displacement of objects and to an apparatus which detects or controls a coordinate position.

Figure 4:
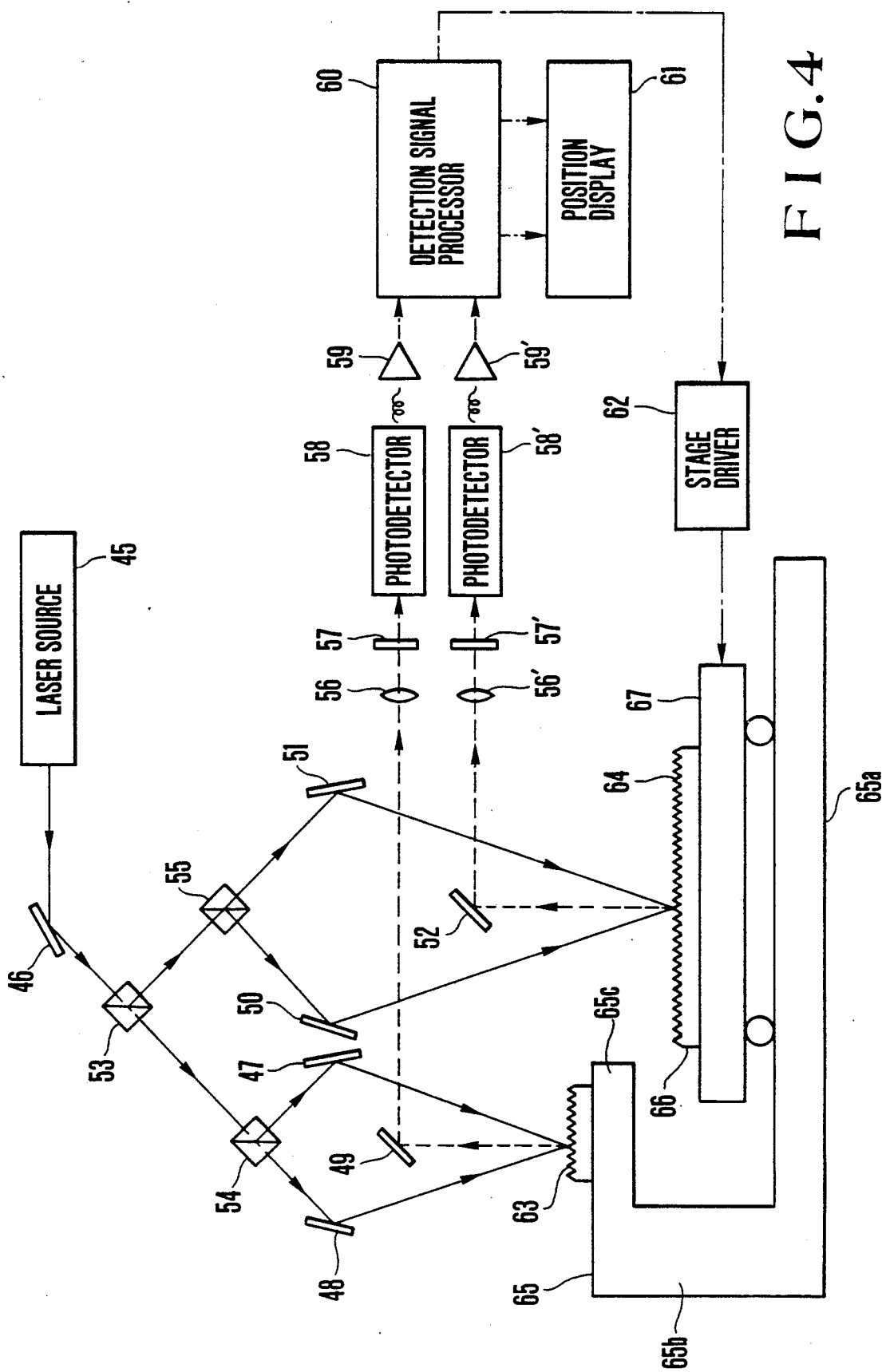
FIG. 4 is a schematic view showing an arrangement of another embodiment of the present invention.

FIG. 4 shows another embodiment of the present invention. In FIG. 4, reference numeral 45 denotes a two-wave orthogonally polarized laser source; 46, 47, 48, 49, 50, 51, and 52, plane mirrors; 53, a beam splitter; 54 and 55, polarization beam splitters; 56 and 56', condenser lenses; 57 and 57', linear polarizers; 58 and 58', photodetectors; 59 and 59', preamplifiers; 60, a detection signal processor; 61, a position display; 62, a stage driver; 63, a first diffraction grating; 64, a second diffraction grating; 65, a first object; 66, a second object; and 67, a moving stage. The first object 65 used in this embodiment is constituted by a base 65a, a portion 65b extending vertically from one end of the base 65a, and a parallel portion 65c extending from one end of the portion 65b parallel to and along the same direction of the base 65a. The first diffraction grating 63 is arranged above the parallel portion 65c. In addition, the moving stage 67 is movably disposed on the base 65a.

In this apparatus, some rays of a laser beam emitted from the two-wave orthogonally polarized laser source 45 are extracted through the plane mirror 46 and the beam splitter 53 and are split into a P-polarized monochromatic beam and an S-polarized monochromatic beam by the polarization beam splitter 54. These beams are incident on the first diffraction grating 63 respectively at predetermined angles through the plane mirrors 47 and 48, and the two diffracted beams from the diffraction grating 63 are optically synthesized. The synthetic beam is detected by the photodetector 58 through the plane mirror 49, the condenser lens 56, and the linear polarizer 57, and supplied to the detection signal processor 60 as an optical heterodyne interference reference beat signal through the preamplifier 59. On the other hand, some rays of the laser beams split by the beam splitter 53 are split into a P-polarized monochromatic beam and an S-polarized monochromatic beams by the polarization beam splitter 55. These beams are incident on the second diffraction grating 64 respectively at predetermined angles throught the plane mirrors 50 and 51. The two diffracted beams from the diffraction grating 64 are optically synthesized, and this synthesized beam is detected by the photodetector 58' through the plane mirror 52, the lens 56', and the linear polarizer 57' and supplied to the detection signal processor 60 as an optical heterodyne interference diffracted beat signal through the preamplifier 59'. The detection signal processor 60 detects a phase difference between the reference beat signal and the diffracted beat signal, and displays a relative displacement between the diffraction gratings 63 and 64 corresponding to the phase difference on the position display 61. In addition, the detection signal processor 60 supplies a control signal to the moving stage 67 through the stage driver 62 so as to obtain a constant phase difference, and servo-controls the second object 66 at a predetermined position. That is, according to the apparatus of this embodiment, the deviation of the second object with respect to the first object 65 is detected on the basis of the position of the first object 65, thereby performing alignment.

FIG. 5 shows still another embodiment of the present invention, in which the present invention is applied to a micro-displacement measuring apparatus. In the apparatus of FIG. 5, some rays of a laser beam emitted from a two-wave orthogonally polarized laser source 117 are extracted through a beam splitter 118. The extracted laser beam is condensed by a condenser lens 119a to cause optical heterodyne interference using a linear polarizer 120a, detected by a photodetector 121a, and then supplied as a reference beat signal to a detection signal processor 128 through a preamplifier 122a. On the other hand, some rays of the laser beam emitted from the two-wave orthogonally polarized laser source 117 are supplied to a polarization beam splitter 124 through the beam splitter 118 and a plane mirror 123a, and split thereby into two monochromatic beams each having planes of polarization orthogonal to each other and slightly different frequencies, i.e., an S-polarized incident beam 130 and a P-polarized incident beam 131. The incident beams 130 and 131 are incident on a reflecting diffraction grating 125 respectively at predetermined incident angles (to be described later) through plane mirrors (incident light adjusting means) 123b and 123c. Two diffracted beams obtained from the diffraction grating 125 are optically synthesized into a synthetic diffracted beam 132 to cause optical heterodyne interference using a plane mirror 123d, a condenser lens 119b, and a linear polarizer 120b. The synthetic diffracted beam 132 is detected by a photodetector 121b, and then supplied as a diffracted beam beat signal to the detection signal processor 128 through a preamplifier 122b. The detection signal processor 128 detects a phase difference (i.e., a phase difference corresponding to a displacement of the diffraction grating 125) between the reference beat signal and the diffracted beat signal, converts the phase difference into a displacement, and displays the displacement of the diffraction grating 125, i.e., the displacement of the moving stage 126 on the displacement display 129. In addition, the detection signal processor 128 supplies a control signal to the stage driver 127 so that the phase difference becomes constant at a preset given value, and servo-controls the diffraction grating 125 at a predetermined position.

Figure 6:
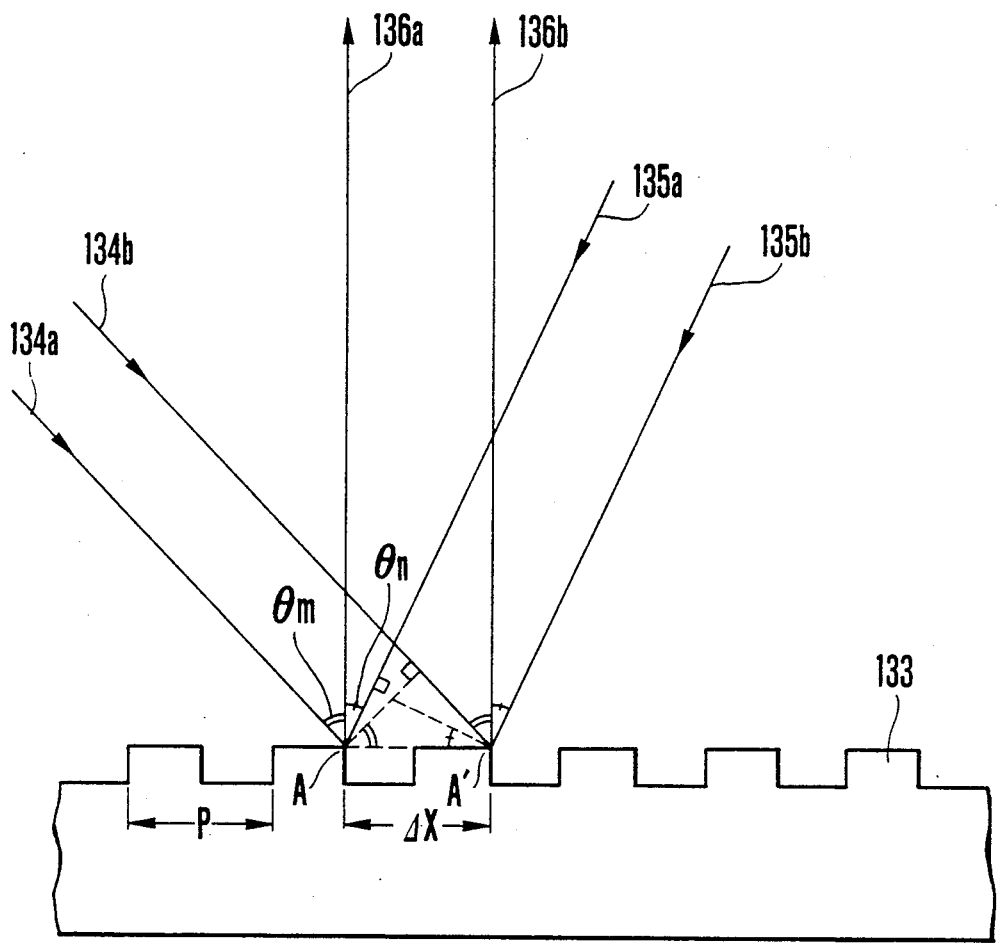
FIG. 6 is an enlarged sectional view of a main part for explaining an operation of the apparatus shown in FIG. 5.

A relationship between the displacement $\Delta X$ of the diffraction grating 125 and the phase difference $\Delta \phi$ between the reference beat signal and the diffracted beam beat signal will be described below with reference to FIG. 6. In FIG. 6, reference numeral 133 denotes a reflecting diffraction grating; 134a and 134b, incident beams each having a wavelength $\lambda_1$; 135a and 135b, incident beams each having a wavelength $\lambda_2$; and 136a and 136b, synthetic diffracted beams. Assume that the incident beams 134a and 135a respectively with wavelengths $\lambda_1$ and $\lambda_2$ having planes of polarization orthogonal to each other and slightly different frequencies are incident on a point A of the diffraction grating 133 respectively at an mth diffraction angle $\theta_m$ and an nth diffraction angle $\theta_n$ with respect to a direction perpendicular to the grating surface of the diffraction grating 133. An mth diffracted beam of the incident beam 134a and an nth diffracted beam of the incident beam 135a are respectively reflected by the point A in the direction perpendicular to the grating surface, and are optically synthesized into the synthetic diffracted beam 136a along the direction perpendicular to the grating surface, so that an optical heterodyne interference beat signal can be detected. Assuming that the diffraction grating 133 moves by the displacement $\Delta X$ so that the point A displaces to a point A', the mth and nth diffracted beams respectively of the incident beams 134b and 135b are reflected by the point A' and are optically synthesized into the synthetic diffracted beam 136b. In this case, assuming that a grating pitch of the diffraction grating 133 is P, a relationship between the mth diffraction angle $\theta_m$, the nth diffraction angle $\theta_n$, and the wavelengths $\lambda_1$ and $\lambda_2$ is obtained as follows:

$$\sin \theta_m = m \cdot \lambda_1 / P \text{ (} m \text{ is a positive integer)} \quad (2)$$

$$\sin \theta_n = n \cdot \lambda_2 / P \text{ (} n \text{ is a positive integer)} \quad (3)$$

wherein the displacement along a Z direction is constant.

When the diffraction grating 133 displaces by $\Delta X$, optical path length differences $\Delta X \cdot \sin \theta_m$ and $-\Delta X \cdot \sin \theta_n$ are generated between the incident beams 134a and 134b and between the incident beams 135a and 135b, respectively. Therefore, a phase difference $\Delta \phi'$ is generated between the optical heterodyne beat signals obtained by the synthetic diffracted beams 136a and 136b. The phase difference $\Delta \phi'$ is represented by the following equation (4):

$$\Delta\phi' = 2\pi \cdot \Delta X \cdot \sin\theta_m/\lambda_1 + 2\pi \cdot \Delta X \cdot \sin\theta_n/\lambda_2 \quad (4)$$

Substitutions of equations (2) and (3) into equation (4) yield the following equation (5):

$$\begin{aligned}\Delta\phi' &= 2\pi \cdot m \cdot \Delta X/P + 2\pi \cdot n \cdot \Delta X/P \\ &= 2\pi \cdot \Delta X/\{P/(m+n)\}\end{aligned} \quad (5)$$

Therefore, the phase difference $\Delta\phi'$ varies as a function of the displacement $\Delta X$ of the diffraction grating 133 by a cycle of P/(m+n).

More specifically, in FIG. 5, assuming that the synthetic diffracted beam 132 from the diffraction grating 125 is a synthetic diffracted beam of the mth diffracted beam of the incident beam 130 and the nth diffracted beam of the incident beam 131, the phase difference $\Delta\phi$ between the reference beat signal and the diffracted beam beat signal detected by the photodetectors 121a and 121b varies by a cycle of displacement P/(m+n) of the diffraction grating 125 where P is a grating pitch of the diffraction grating 125. Therefore, the phase difference is phase-detected and converted into DC signals by the detection signal processor 128 to generate pulse signals from the DC signals, e.g., every phase difference of 0°, and the pulse signals are counted to measure the displacement of the diffraction grating 125 with precision of a resolution of P/(m+n). In addition, when changes in the DC signals with phase differences of 0° to 360° are interpolated into, e.g., 1/360 to set a detection resolution of the phase difference to be 1° and phase difference in displacement of the diffraction grating between the pulses is detected, the displacement of the diffraction grating 125 can be detected with a resolution of P/(m+n) 360 to obtain a high resolution. Note that a direction of the displacement of the diffraction grating can be easily determined by discrimination positive/negative sign of a phase difference between the diffracted beam beat signal and the reference beat signal.

Figure 7:
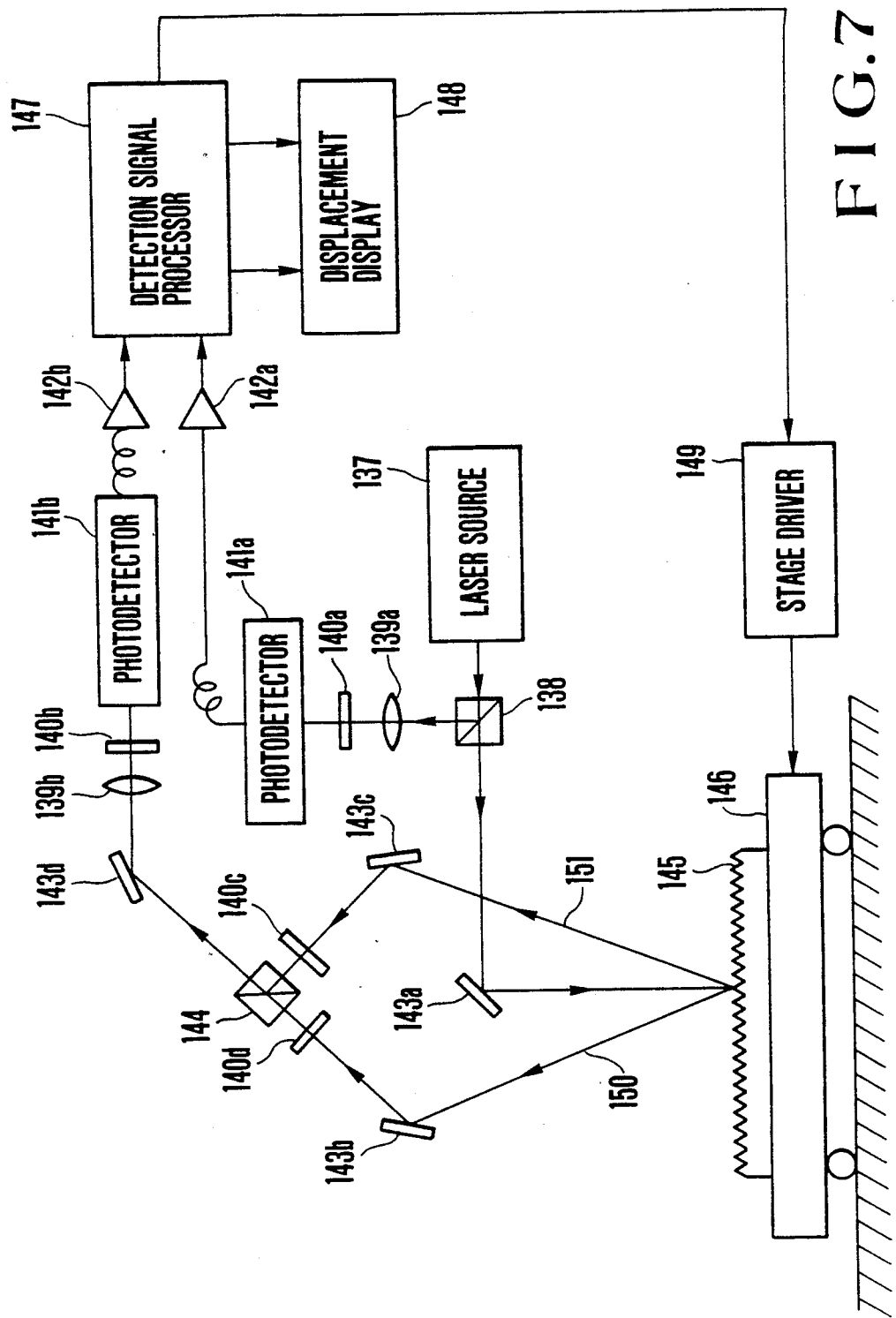
FIG. 7 is a schematic view showing an arrangement of still another embodiment of the present invention.

FIG. 7 shows still another embodiment of the present invention, in which the present invention is applied to a micro-displacement measuring/adjusting apparatus. In FIG. 7, incident/reflecting directions of the laser beams with respect to a diffraction grating 145 are opposite to those of the embodiment shown in FIG. 4. An orthogonally polarized monochromatic beam from a two-wave orthogonally polarized monochromatic laser source 137 is incident vertically on a grating surface of the diffraction grating 145 through a beam splitter 138 and a plane mirror (incident angle adjusting means) 143a. Each of diffracted beams 150 and 151 is constituted by P- and S-polarized beams having planes of polarization orthogonal to each other. A P-polarized monochromatic beam is extracted from the diffracted beam 150 through a plane mirror 143b, a linear polarizer 140d, and a polarization beam splitter 144, and an S-polarized monochromatic beam is extracted from the diffracted beam 151 through a plane mirror 143c, a linear polarizer 140c, and the polarization beam splitter 144. The P- and S-polarized monochromatic beams are optically synthesized to cause optical heterodyne interference through a plane mirror 143d, a condenser lens 139b, and a linear polarizer 140b, thereby detecting a diffracted beam beat signal by a photodetector 141b. On the other hand, some rays of the laser beam from the two-wave orthogonally polarized laser source 137 are extracted by the beam splitter 138 to cause optical heterodyne interference through a condenser lens 139a and a linear polarizer 140a, thereby detecting a reference beat signal by a photodetector 141a. Similar to the case of the embodiment shown in FIG. 4, the reference beat signal and the diffracted beam beat signal detected by the photodetectors 141a and 141b are supplied to a detection signal processor 147 through corresponding preamplifiers 142a and 142b. The detection signal processor 147 phase-detects the signals, converts a phase difference into a displacement of the diffraction grating, and displays the displacement on a displacement display 148. In addition, the detection signal processor 147 supplies a control signal to a stage driver 149 so as to obtain a constant phase difference, and servo-controls the diffraction grating 145 to a predetermined position.

Figure 8:
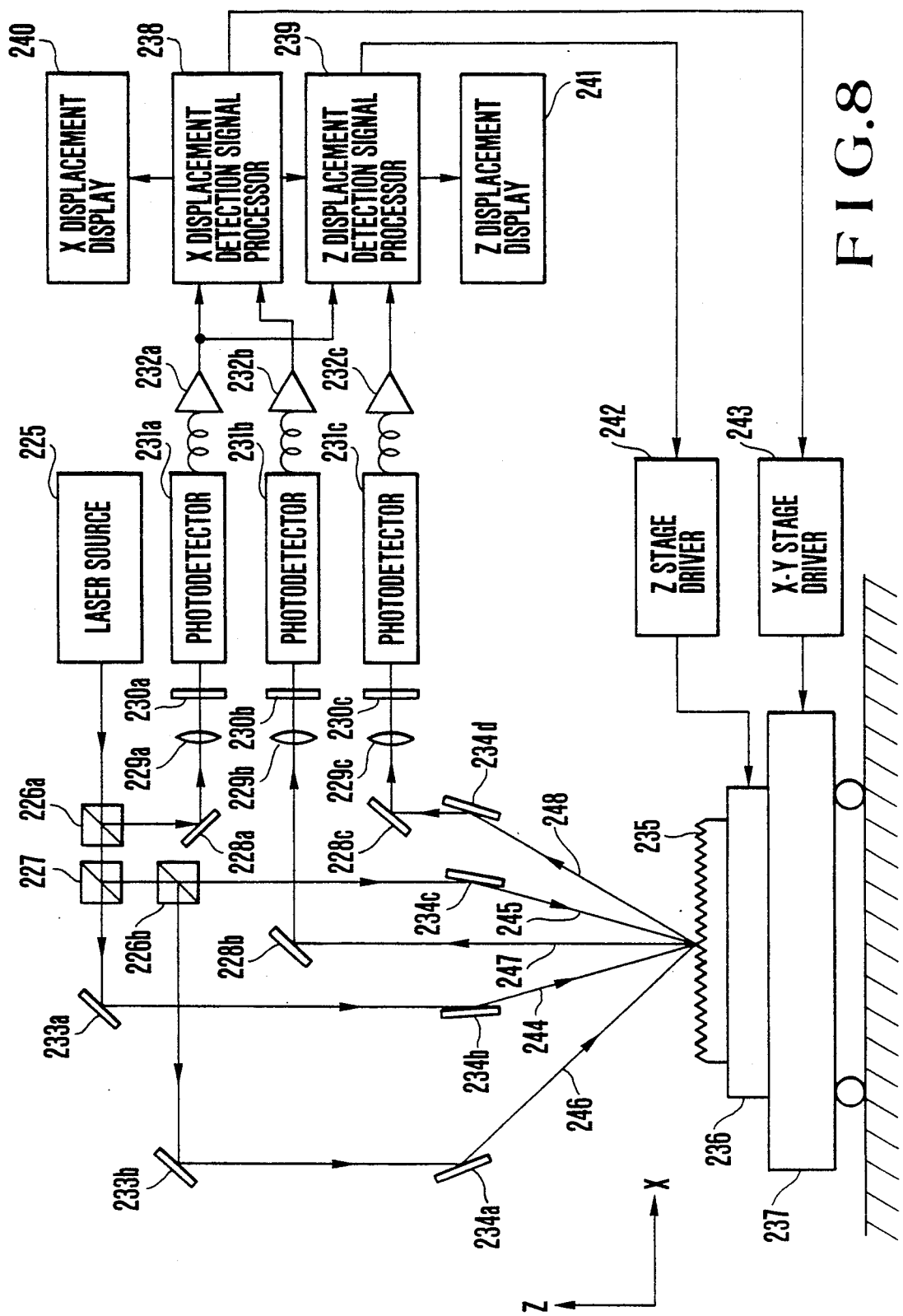
FIG. 8 is a schematic view showing an arrangement of still another embodiment of the present invention.

FIG. 8 shows still another embodiment of the present invention, in which the present invention is applied to a micro-displacement measuring/adjusting apparatus. In FIG. 8, some rays of a laser beam emitted from a two-wave orthogonally polarized laser source 225 are detected by a photodetector 231a (first light synthesizing-/detecting means) through a beam splitter 226a, a plane mirror 228a, a condenser lens 229a, and a linear polarizer 230a, and supplied as a reference beat signal of optical heterodyne interference to an X displacement detection signal processor 238 and a Z displacement detection signal processor 239 through a preamplifier 232a. On the other hand, the laser beam emitted from the two-wave orthogonally polarized laser source 225 is supplied to a polarization beam splitter 227 through the beam splitter 226a and split into two laser beams, i.e., a P-polarized beam and an S-polarized beam. The P-polarized beam component is incident as an incident beam 244 on a reflecting diffraction grating 235 at a predetermined incident angle (to be described later) through plane mirrors 233a and 234b. The S-polarized beam component is split by a beam splitter 226b (splitting means), and the split components are respectively incident on the reflecting diffraction grating 235 as an incident beam 245 through a plane mirror 234c and as an incident beam 246 through plane mirrors 233b and 234a. A synthetic diffracted beam 247 obtained from the diffraction grating 235 by the incident beams 244 and 245 is detected by a photodetector 231b (second light synthesizing/detecting means) through a plane mirror 228b, a condenser lens 229b, and a linear polarizer 230b, and supplied as a first optical heterodyne interference beat signal to the X displacement detection signal processor 238 through a preamplifier 232b. A synthetic diffracted beam 248 obtained from the diffraction grating 235 by the incident beams 244 and 246 is detected by a photodetector 231c (third light synthesizing/detecting means) through plane mirrors 234d and 228c, a condenser lens 229c, and a linear polarizer 230c, and supplied as a second optical heterodyne interference beat signal to the Z displacement detection signal processor 239 through a preamplifier 232c. The X displacement detection signal processor 238 detects a phase difference between the first optical heterodyne interference beat signal and the reference beat signal corresponding to the displacement of the diffraction grating 235 with respect to a direction (a left-to-right direction in FIG. 8 and to be referred to as an X direction hereinafter) orthogonal to a grating line direction in a diffraction grating surface, converts the phase difference into a displacement, and displays the displacement on an X displacement display 240. The Z displacement detection signal processor 239 detects a phase difference between the reference beat signal and the second optical heterodyne interference beat signal, and receives a phase difference signal (first phase difference signal) between the reference beat signal and the first optical heterodyne interference beat signal from the X displacement detection signal processor 238 to perform an addition. Then, the Z displacement detection signal processor 239 generates a phase difference signal (second phase difference signal) corresponding to the displacement of the diffraction grating 235 along a normal direction (an upper-to-lower direction in FIG. 8 and to be referred to as a Z direction hereinafter) in the diffraction grating surface, converts the phase difference into a Z displacement, and displays the displacement on a Z displacement display 241. In addition, the X and Z displacement detection signal processors 238 and 239 supply control signals to Z and X-Y stage drivers 242 and 243 so that the phase difference becomes constant at a preset given value, and move a Z stage 236 and an X-Y moving stage 237 movable thereon to servo-control the diffraction grating 235 to a predetermined position.

In this apparatus, when the incident beams 244 and 245 are incident respectively at nth diffraction angles with respect to the Z direction, a relationship between a displacement $\Delta X$ of the diffraction grating 235 and a phase difference $\Delta\phi x$ between the reference beat signal and the first optical heterodyne interference beat signal is obtained by the following equation (7) since m=n from the above-mentioned equation (4):

$$\Delta\phi x = 2\pi \cdot \Delta X / \{P/2n\} \qquad (7)$$

where P is a grating pitch of the diffraction grating 235. The phase difference does not vary with respect to displacement $\Delta Z$ along the Z direction but remains constant.

Figure 9:
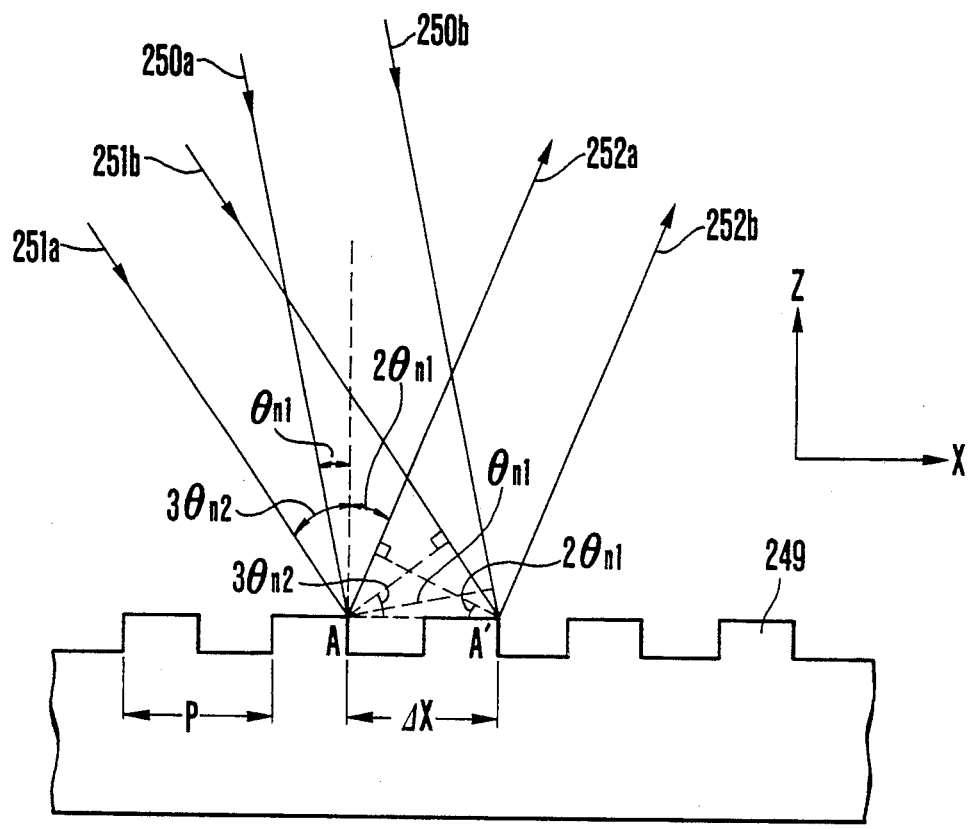
FIGS. 9 and 10 are enlarged sectional views of a main part for explaining an operation of the apparatus shown in FIG. 8.

On the other hand, the following relationship is present between the displacements $\Delta X$ and $\Delta Z$ of the diffraction grating 235 and the phase difference $\Delta\phi zx$ between the reference beat signal and the second optical heterodyne interference beat signal. The relationship will be described with reference to FIGS. 9 and 10. In FIG. 9, reference numeral 249 denotes a reflecting diffraction grating; 250a and 250b, incident beams having a wavelength $\lambda_1$; 251a and 251b, incident beams having a wavelength $\lambda_2$; and 252a and 252b, synthetic diffracted beams.

When the incident beams 250a and 251a respectively having wavelengths $\lambda_1$ and $\lambda_2$ having planes of polarization orthogonal to each other and slightly different frequencies are incident on, e.g., a point A of the diffraction grating 249 respectively at an nth diffraction angle $\theta n_1$ and an angle $3\theta n_2$ three times the nth diffraction angle $\theta n_1$ with respect to the Z direction, a +nth diffracted beam of the incident beam 250a and a −nth diffracted beam of the incident beam 251a are respectively reflected by the point A of the diffraction grating 249 along a direction of an angle $2\theta n_1$ twice the nth diffraction angle with respect to the Z direction. The +nth and −nth diffracted beams of the incident beams 250a and 251a are optically synthesized into a synthetic diffracted beam 252a, so that an optical heterodyne interference beat signal can be detected.

When the diffraction grating 249 moves by the displacement $\Delta X$ to displace the point A to a point A', +nth and −nth diffracted beams of the incident beams 250b and 251b are optically synthesized to be a synthetic diffracted beam 252b. When the diffraction grating 249 is displaced by the displacement $\Delta X$, an optical path length difference $\Delta X \cdot (\sin \theta n_1 - \sin 2\theta n_1)$ is generated between the incident beams 250a and 250b, and an optical path length difference $\Delta X \cdot (\sin 3\theta n_2 - \sin 2\theta n_2)$ is generated between the incident beams 251a and 251b. Therefore, a phase difference $\Delta\phi' zx$ is generated in an optical heterodyne interference beat signals obtained from the synthetic diffracted beams 252a and 252b. The phase difference $\Delta\phi' zx$ is represented by the following equation (8):

$$\Delta\phi'zx = 2\pi \cdot \Delta X \cdot \{(\sin \theta n_1 - \sin 2\theta n_1)/\lambda_1 - (\sin 3\theta n_2 - \sin 2\theta n_2)/\lambda_2\} \qquad (8)$$

Since $\theta n_1 \approx \theta n_2$, $\sin 3\theta n_2 \approx 3 \sin \theta n_2$, and $\lambda_1 = \lambda_2$, equation (8) is also represented as follows:

$$\begin{aligned}\Delta\phi'zx &\approx 2\pi \cdot \Delta X \cdot (-2\sin\theta n_1)/\lambda_1 \\ &= 2\pi \cdot \{-\Delta X/(P/2n_1)\} = -\Delta\phi x\end{aligned} \qquad (9)$$

A phase shift direction of the phase difference $\Delta\phi'zx$ between the reference beat signal and the second optical heterodyne interference beat signal with respect to the displacement $\Delta X$ is opposite to the phase difference $\Delta\phi x$ between the reference beat signal and the first optical heterodyne interference beat signal represented by equation (7).

Figure 10:
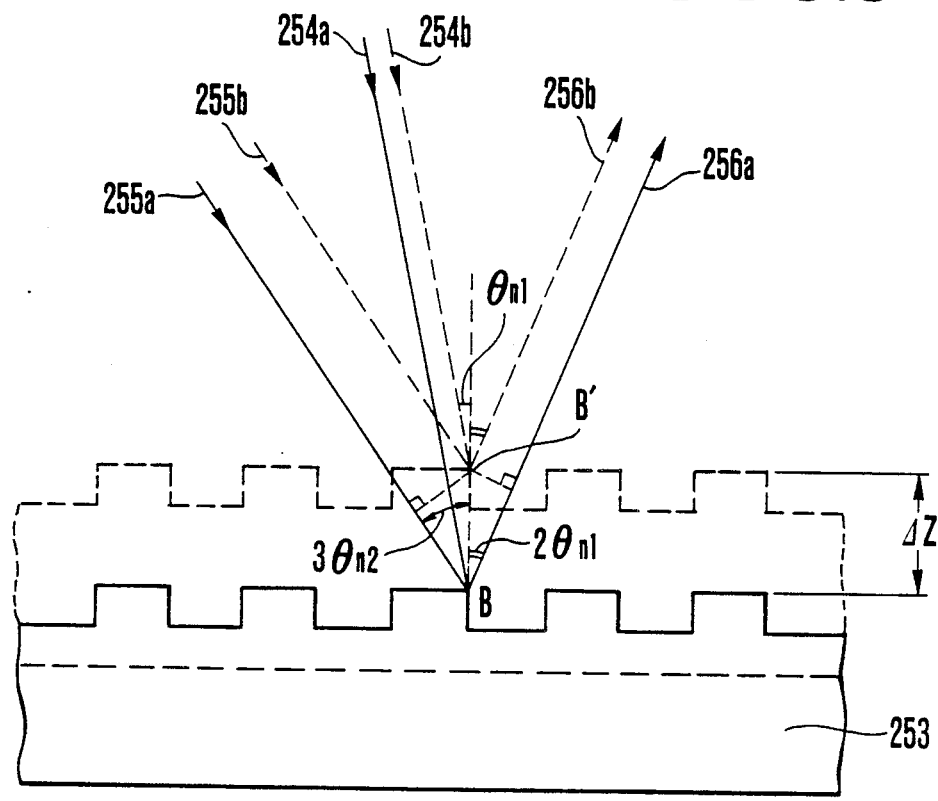

In FIG. 10, reference numeral 253 denotes a reflecting diffraction grating; 254a and 254b, incident beams having a wavelength $\lambda_1$; 255a and 255b, incident beams having a wavelength $\lambda_2$; and 256a and 256b, synthetic diffracted beams. When the incident beams 254a and 255a respectively having wavelengths $\lambda_1$ and $\lambda_2$ are incident on, e.g., a point B of the diffraction grating 253 respectively at an nth diffraction angle $\theta n_1$ and an angle $3\theta n_2$ three times the nth diffraction angle with respect to the Z direction, a +nth diffracted beam of the incident beam 254a and a −nth diffracted beam of the incident beam 255a are reflected along a direction of an angle $2\theta n_1$ twice the nth diffraction angle with respect to the Z direction to be a synthetic diffracted beam 256a, so that an optical heterodyne interference beat signal can be detected. When the diffraction grating 253 moves by the displacement $\Delta Z$ from the point B to a point B', +nth and −nth diffracted beams of the incident beams 254b and 255b are optically synthesized to be a synthetic diffracted beam 256b. When the diffraction grating 253 is displaced by the displacement $\Delta Z$, an optical path length difference $-\Delta Z (\cos \theta n_1 + \cos 2\theta n_1)$ is generated between the incident beams 254a and 254b, and an optical path length difference $-\Delta Z (\cos 3\theta n_2 + \cos 2\theta n_2)$ is generated between the incident beams 255a and 255b. Therefore, a phase difference $\Delta\phi'' zx$ is generated in the optical heterodyne interference beat signals obtained from the synthetic diffracted beams 256a and 256b. The phase difference $\Delta\phi'' zx$ is obtained by the following equation (10):

$$\Delta\phi''zx = 2\pi \cdot \Delta Z \cdot \{(\cos 3\theta n_2 + \cos 2\theta n_2)/\lambda_2 - (\cos \theta n_1 + \cos 2\theta n_1)/\lambda_1\} \qquad (10)$$

Since $\lambda_1 \approx \lambda_2$ and $\theta n_1 = \theta n_2$, equation (10) is also represented as follows:

$$\Delta\phi''zx = 2\pi \cdot \Delta Z \cdot (\cos 3\theta n_1 - \cos \theta n_1)/\lambda_1 \qquad (11)$$

Therefore, it is found that a phase is shifted by a cycle of $\Delta Z = \lambda_1/(\cos 3\theta n_1 - \cos \theta n_1)$.

According to the equations (9) and (11), a phase difference $\Delta \phi zx$ between the reference beat signal and the second optical heterodyne interference beat signal is represented by the following equation (12) with respect to the micro-displacements $\Delta X$ and $\Delta Z$ of the diffraction grating 235 (FIG. 8):

$$\Delta \phi zx = \Delta \phi zx' + \Delta \phi''zx \qquad (12)$$
$$= -\Delta \phi x + 2\pi \cdot \Delta Z \cdot (\cos 3\theta n_1 - \cos \theta n_1)/\lambda_1$$

That is, the Z displacement detection signal processor 239 detects the phase difference $\Delta \phi zx$ between the reference beat signal and the second optical heterodyne interference beat signal, and performs an addition of the phase difference $\Delta \phi zx$ and the phase difference $\Delta \phi x$ between the reference beat signal and the first optical heterodyne interference beat signal detected by the X displacement detection signal processor, thereby detecting the phase difference signal $\Delta \phi z$ corresponding to the micro-displacement $\Delta Z$ of the diffraction grating 235 as represented by the following equation (13):

$$\Delta \phi z = \Delta \phi zx + \Delta \phi x = 2\pi \cdot \Delta Z \cdot (\cos 3\theta n_1 - \cos \theta n_1)/\lambda_1 \qquad (13)$$

Figure 11:
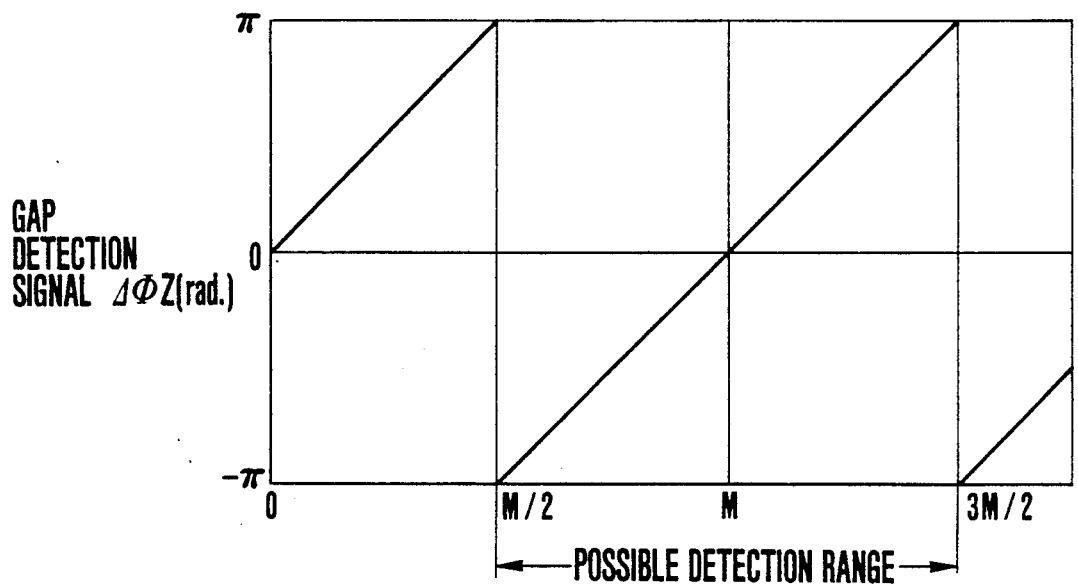
FIG. 11 is a graph of a gap characteristic showing a relationship between a gap and a phase difference between beat signals.

A relationship between the gap $\Delta Z$ and the gap detection signal $\Delta \phi z$ is shown in FIG. 11. In FIG. 11, the abscissa represents the gap $\Delta Z$, and the ordinate represents the gap detection signal $\Delta \phi z$. Values of $\Delta Z$ from M/2 to 3M/2 fall within a possible detection range. Note that M is a gap cycle determined by the pitch of the grating and $1/M = (\cos 3\theta n_1 - \cos \theta n_1)/\lambda_1$.

Therefore, the detection signal processors 238 and 239 respectively detect the phases and convert the phase difference signals $\Delta \phi x$ and $\Delta \phi z$ into DC signals to generate pulse signals, e.g., every phase difference 0°. The pulse signals are respectively counted to measure displacements along the X and Z directions of the diffraction grating 235 with resolutions of P/2n and $\lambda_1/(\cos 3\theta n_1 - \cos \theta n_1)$. In addition, changes in the DC signals of phase differences from 0° to 360° are interpolated into, e.g., 1/360 to set a detection resolution of the phase difference to be 1°, and the phase difference in the displacement of the diffraction grating 235 is detected between the pulses, thereby detecting the displacement of the diffraction grating 235 along the X and Z directions with resolutions of P/(2n·360) and $\lambda_1/\{(\cos 3\theta n_1 - \cos \theta n_1)\cdot 360\}$. Note that directions of displacements along the X and Z directions can be easily determined by discriminating a positive/negative sign of the phase difference of the first or second optical heterodyne interference beat signal with respect to the reference beat signal.

FIG. 12 shows still another embodiment of the present invention, in which the present invention is applied to a micro-displacement measuring/adjusting apparatus. In FIG. 12, incident directions of laser beams with respect to a diffraction grating 266 are partially opposite to those of the apparatus of the embodiment shown in FIG. 8. An orthogonally polarized laser beam is incident as an incident beam 276a onto the diffraction grating 266 along the Z direction through beam splitters 258a and 258b. Nth diffracted beams 277a and 277b from the diffraction grating 266 are constituted by P- and S-polarized beams each having planes of polarization orthogonal to each other. An S-polarized monochromatic beam is extracted from the diffracted beam 277a through plane mirrors 265b and 259c and a polarization beam splitter 275a, and a P-polarized monochromatic beam is extracted from the diffracted beam 277b through plane mirror 265c and polarization beam splitters 275b and 275a. Both the polarized monochromatic beams are optically synthesized to cause optical heterodyne interference through a plane mirror 259b, a condenser lens 260b, and a linear polarizer 261b, and a first optical heterodyne interference beat signal is detected by a photodetector (second light synthesizing detecting means) 262b.

A P-polarized monochromatic beam is extracted from laser beams split by a beam splitter 258b (splitting means) through a plane mirror 259d and a linear polarizer 261d. After rotating a plane of polarization through 90° by a halfwave plate 264, the P-polarized monochromatic beam is incident as an incident beam 276b onto the diffraction grating 266 at an angle twice the nth diffraction angle with respect to the Z direction through a plane mirror 265a. A $-$nth diffracted beam of the incident beam 276b is diffracted along the same direction as that of the diffracted beam 277b to cause optical heterodyne interference with an S-polarized monochromatic beam of a $+$nth diffracted beam 277b of the incident beam 276a. A synthetic diffracted beam of the $-$nth diffracted beam of the incident beam 276b and the S-polarized beam of the diffracted beam 277b is extracted through the plane mirror 265c and the polarization beam splitter 275b to cause optical heterodyne interference through a condenser lens 260c and a linear polarizer 261c, thereby detecting a second optical heterodyne interference beat signal by a photodetector 262c (third light synthesizing/detecting means).

In addition, some rays of the laser beam are extracted by the beam splitter 258a to cause optical heterodyne interference through the plane mirror 259a, the condenser lens 260a, and the linear polarizer 261a, thereby detecting a reference beat signal by a photodetector 262a (first light synthesizing/detecting means). The reference beat signal and the first and second optical heterodyne interference beat signals are respectively supplied to preamplifiers 263a, 263b, and 263c. The reference beat signal and the first optical heterodyne interference beat signal are supplied to an X displacement detection signal processor 271, and the reference beat signal and the second optical heterodyne interference beat signal are supplied to a Z displacement detection signal processor 272. Similar to the first embodiment, the detection signal processors 271 and 272 detect the phases, convert phase differences $\Delta \phi x$ and $\Delta \phi z$ into displacements $\Delta X$ and $\Delta Z$, and display them on displacement displays 273 and 274. In addition, the detection signal processors 271 and 272 supply control signals to stage drivers 270 and 269, respectively, so as to obtain a constant phase difference, and move a Z stage 267 and an X-Y stage 268 movable thereon, thereby servo-controlling the diffraction grating to a predetermined position.

In this embodiment, it is obvious that the following equations (14) and (15) can be established between the displacements $\Delta X$ and $\Delta Z$ of the grating 266 and the phase difference signals $\Delta \phi x$ and $\Delta \phi z$ by analyzing in the same manner as described above:

$$\Delta \phi x = 2\pi \cdot \Delta X/(P/2n) \qquad (14)$$

where P is a grating pitch of the diffraction grating 266.

$$\Delta\phi z = 2\pi \cdot \Delta Z (\cos 2\theta n_1 - 1)/\lambda_1 \qquad (15)$$

where $\theta n_1$ is the nth diffraction angle.

Figure 13:
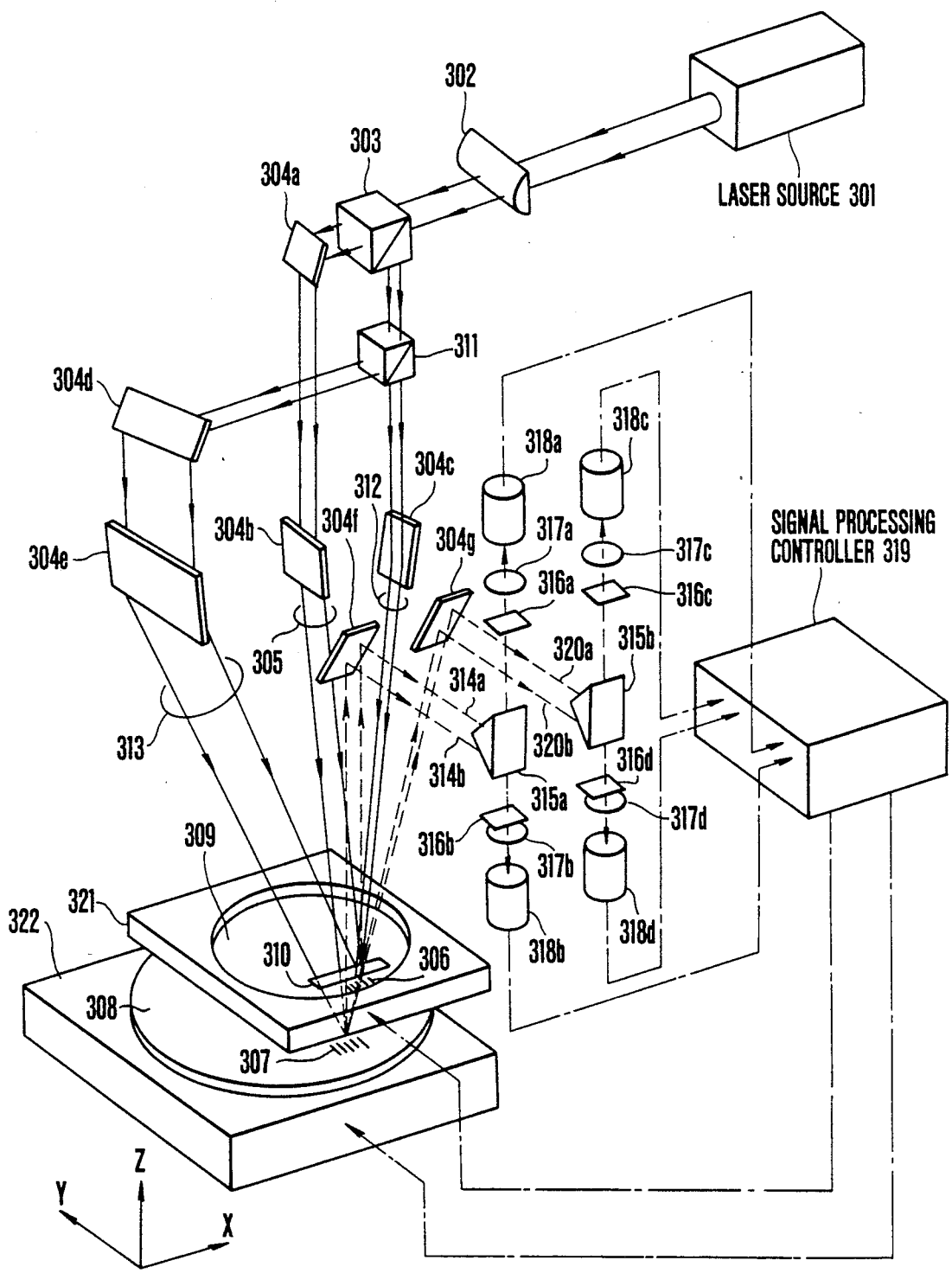
FIG. 13 is a schematic perspective view showing an arrangement of still another embodiment of the present invention.

FIG. 13 shows still another embodiment of the present invention, in which the present invention is applied to an X-ray exposure apparatus.

A laser beam emitted from a two-wave orthogonally polarized laser source 301 is converted into an elliptic beam through a cylindrical lens 302. The elliptic beam is split into a linearly polarized beam having horizontal components (P-polarized beam component) and a linearly polarized beam having vertical component (S-polarized components) with the frequency slightly different from that of P-polarized beam component by a polarization beam splitter 303. The P-polarized beam components are incident as incident beams 305 on reflecting diffraction gratings 306 and 307 at a predetermined incident angle (to be described later) through plane mirrors 304a and 304b, respectively. Note that the incident beam 305 is incident on diffraction grating 307 provided to a wafer 308 through a window 310 formed in a mask 309. On the other hand, the S-polarized beam components are split by a beam splitter 311. Some rays of the split S-polarized beam components are incident as an incident beam 312 and some rays thereof are incident as an incident beam 313 on reflecting diffraction gratings 306 and 307 at predetermined incident angles (to be described later) through a plane mirror 304c and through plane mirrors 304d and 304e, respectively. Similar to the incident beam 305, the beams are incident on the diffraction grating 307 through the window 310.

The reflecting diffraction gratings 306 and 307 are offset along the grating line direction (Y direction), respectively, and are arranged in the same elliptic beam spot range of the respective two incident beams. In addition, pitches of the diffraction gratings 306 and 307 are set equal to each other.

A synthetic diffracted beam of the incident beams 305 and 312 obtained from the first diffraction grating 306, i.e., a synthetic diffracted beam 314a of a diffracted beam of the incident beam 305 and a diffracted beam (first diffracted beam) of the incident beam 312 obtained from the first diffraction grating 306, and a synthetic diffracted beam obtained from the second diffraction grating 307 and extracted through the window 310, i.e., a synthetic diffracted beam 314b of a diffracted beam of the incident beam 305 and a diffracted beam (third diffracted beam) of the incident beam 312 obtained from the second diffraction grating 307, are reflected by a plane mirror 304f along a given direction and then split by a prism-like mirror 315a. The synthetic diffracted beam 314a is detected by a photodetector 318a through a linear polarizer 316a and a condenser lens 317a and supplied as a first optical heterodyne interference beat signal to a signal processing controller 319. The synthetic diffracted beam 314b is detected by a photodetector 318b through a linear polarizer 316b and a condenser lens 317b and supplied as a second optical heterodyne interference beat signal to the signal processing controller 319.

A synthetic diffracted beam of the incident beams 305 and 313 obtained from the first diffraction grating 306, i.e., a synthetic diffracted beam 320a of a diffracted beam of the incident beam 305 and a diffracted beam (second diffracted beam) of the incident beam 313 obtained from the first diffraction grating 306, and a synthetic diffracted beam obtained from the second diffraction grating 307 and extracted through the window 310, i.e., a synthetic diffracted beam 320b of a diffracted beam of the incident beam 305 and a diffracted beam (fourth diffracted beam) of the incident beam 313 obtained from the second diffraction grating 307, are reflected by a plane mirror 304g along a given direction and then split by a prism-like mirror 315b. One is detected by a photodetector 318c through a linear polarizer 316c and a condenser lens 317c, the other is detected by a photodetector 318d through a linear polarizer 316d and a condenser lens 317d, and both are supplied as third and fourth optical heterodyne interference signals to the signal processing controller 319.

The signal processing controller 319 obtains a phase difference between the first and second optical heterodyne interference beat signals. In this case, either of the beat signals is used as a reference. This phase difference corresponds to a relative deviation between the first and second diffraction gratings 306 and 307 with respect to a direction (X direction) orthogonal to a grating line direction (Y direction) in the grating surface of the diffraction grating. Therefore, by moving a mask stage 321 having the mask 309 thereon or a wafer stage 322 having the wafer 308 thereon along the X direction so as to set the phase difference to be 0, a pattern on the mask surface can be aligned with high precision at a predetermined position on the wafer surface.

The signal processing controller 319 obtains a phase difference between the third and fourth optical heterodyne interference beat signals using either of them as a reference, and adds this phase difference to the above phase difference between the first and second optical heterodyne interference beat signals. A signal representing the sum of the first and second beat signals and a signal representing the sum of the third and fourth beat signals correspond to a gap between the first and second diffraction gratings 306 and 307 along a normal direction (Z direction) of the grating surface. Therefore, by moving the mask stage 321 or the wafer stage 322 along the Z direction so as to set the signals to be 0, the gap can be set with high precision to be a predetermined value.

A method of detecting/aligning the X direction deviation will be described in detail with reference to FIG. 14.

Figure 14:
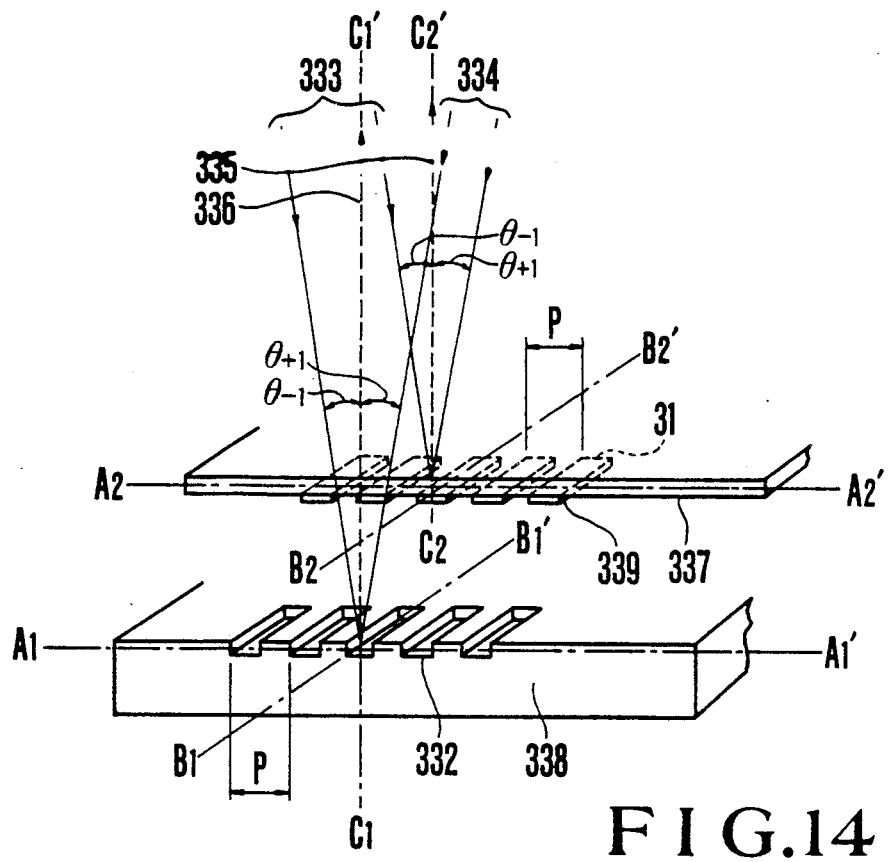
FIGS. 14 and 15 are enlarged perspective sectional views of a main part for explaining an operation of the apparatus shown in FIG. 13.

In FIG. 14, reference numeral 331 denotes a reflecting diffraction grating (first diffraction grating); 332, a reflecting diffraction grating (second diffraction grating); 333 and 334, two incident beams each having slightly different frequencies; 335 and 336, diffracted beams (optical heterodyne interference diffracted beams); 337, a mask (first object) (more specifically, a thin transparent film constituting a mask and the diffraction grating 331); 338, a wafer; and 339, a thin opaque film. In addition, $B_1$—$B_1'$ represents a grating line direction of the second diffraction grating; $B_2$—$B_2'$, a grating line direction of the first diffraction grating; $A_1$—$A_1'$, a grating pitch direction perpendicular to the direction $B_1$—$B_1'$; $A_2$—$A_2'$, a grating pitch direction perpendicular to the direction $B_2$—$B_2'$; $C_1$—$C_1'$, a direction (normal direction) perpendicular to a grating surface of the diffraction grating 332; and $C_2$—$C_2'$, a direction (normal direction) perpendicular to a grating surface of the diffraction grating 331. In the embodiment shown in FIG. 14, pitches of the first and second diffraction gratings 331 and 332 are set equally to be P, the diffraction grating 331 is offset from the diffraction grating 332 along the direction $B_2$—$B_2'$ (grating line direction) so as not to overlap the grating surface of the diffraction grating 332, and the extracting window 310 (not shown in FIG. 14) is provided above the diffraction grating 332 along the normal direction. Incident angles of the incident beams 333 and 334 are set at ±1st reflecting diffracted beam angles $\theta_{-1}=\sin^{-1}(\lambda_1/P)$ and $\theta_{+1}=\sin^{-1}(\lambda_2/P)$ respectively of the diffraction gratings 331 and 332 with respect to the normal direction $C_1$—$C_1'$ (or $C_2$—$C_2'$) of the diffraction grating by adjusting angles of the mirrors 304b and 304c. Wavelengths of the incident beams 333 and 334 are $\lambda_1$ and $\lambda_2$, respectively, a frequency difference $\Delta f$ is several KHz to several hundred MHz, and $\Delta f = C \cdot |1/\lambda_1 = 1/\lambda_2|$ (where C represents a velocity of light), so that $\theta_{-1}=\theta_{+1}$ since $\Delta f << C$.

With the above arrangement, the incident beams 333 and 334 incident on the diffraction gratings 331 and 332 are −1st reflectively diffracted by the reflecting diffraction gratings 331 and 332 along the normal directions (directions $C_2$—$C_2'$ and $C_1$—$C_1'$) of the grating surface and optically synthesized to be optical heterodyne interference diffracted beams 335 and 336, respectively. The optical heterodyne interference diffracted beams 335 and 336 are beams diffracted by the different diffraction gratings 331 and 332, but incident angles of the incident beams 333 and 334 are symmetrical about the normal to the grating surface. Therefore, since the diffraction gratings 331 and 332 are offset from each other along the normal directions (directions $C_1$—$C_1'$ and $C_2$—$C_2'$) and the grating line directions (directions $B_1$—$B_1'$ and $B_2$—$B_2'$), respectively, changes in optical path lengths of the incident beams 333 and 334 to the diffraction grating 331 or 332 equal to each other. As a result, a phase difference between the beat signals obtained from the diffracted beams 335 and 336 is not adversely affected by a phase shift due to displacement along a direction perpendicular to the grating surface and the grating line direction of the diffraction gratings 331 and 332.

More specifically, the phase difference between the beat signals obtained from the diffracted beams 335 and 336 varies in accordance with only spatial disposition with respect to the pitch directions (directions $A_2$—$A_2'$ and $A_1$—$A_1'$), i.e., a relative deviation of the diffraction gratings 331 and 332. When the respective grating lines of the diffraction gratings 331 and 332 are aligned straight along the grating line directions (directions $B_1$—$B_1'$ and $B_2$—$B_2'$) or offset by $\Delta P/2$ or its integer multiple, the phase difference between the beat signals obtained from the diffracted beams 335 and 336 becomes 0°, thereby completing alignment. Assuming that the relative deviation between the diffraction gratings 331 and 332 along the direction $A_1$—$A_1'$ or $A_2$—$A_2'$ is $\Delta X$ and the phase difference between the beat signals is $\Delta\phi$ (°), the phase difference is obtained by the following equation (16):

$$\Delta\phi = 2\pi \cdot \Delta X/(P/2) \quad (16)$$

The phase difference $\Delta\phi$ varies in synchronism with ½ the relative deviation of the diffraction grating pitch.

A method of detecting/aligning a relative position or a gap, i.e., a gap setting method in the Z direction will be described below with reference to FIG. 15.

Figure 15:
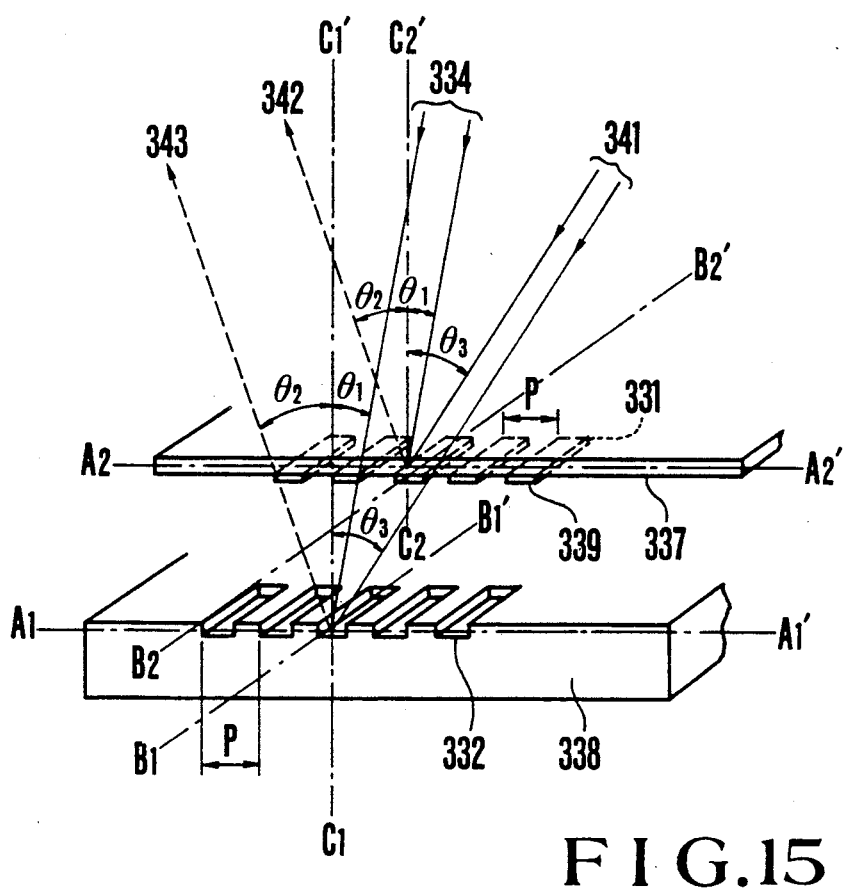

In FIG. 15, reference numeral 341 denotes an incident beam split by the beam splitter 311 and an incident angle of the beam is adjusted by the plane mirror 304e; and 342 and 343, optical heterodyne interference diffracted beams. An incident angle of the incident beams is set by the plane mirror 304b at an angle $\theta_1$ of the 1st reflectively diffracted beam with respect to the normal direction $C_1$—$C_1'$ (or $C_2$—$C_2'$) of the grating surface of the diffraction grating. When the incident direction of the incident beam 341 is set by the plane mirror 304e at an angle $\theta_3$ of the 3rd reflectively diffracted beam with respect to the direction $C_1$—$C_1'$ (or $C_2$—$C_2'$), a +1st diffracted beam of the incident beam 334 and a −1st diffracted beam of the incident beam 341 are synthesized along the direction (angle $\theta_2$) of the 2nd reflectively diffracted beam with respect to the direction $C_1$—$C_1'$ (or $C_2$—$C_2'$) to be optical heterodyne interference diffracted beams 342 and 343. Since incident angles of the incident beams 343 and 341 are nonsymmetrical with respect to the normal direction of the grating surface, changes in optical path lengths of the incident beams 334 and 341 to the diffraction gratings 331 and 332 are not equal to each other with respect to the relative displacement of the diffraction grating along the pitch direction $A_1$—$A_1'$ (or $A_2$—$A_2'$) and the relative displacement of the grating surface along the normal direction $C_1$—$C_1'$ (or $C_2$—$C_2'$).

More specifically, assuming that the relative deviation between the diffraction gratings 331 and 332 along the direction $A_1$—$A_1'$ (or $A_2$—$A_2'$) is $\Delta X$ and a gap of the grating surface along the normal direction $C_1$—$C_1'$ (or $C_2$—$C_2'$) is $\Delta Z$, the phase difference $\Delta\phi xz$ between the beat signals obtained from the diffracted beams 342 and 343 is represented by the following equation (17):

$$\Delta\phi xz = 2\pi \cdot (-\Delta X)/(P/2) + 2\pi \cdot \Delta Z \cdot (\cos\theta_3 - \cos\theta_1)/\lambda_1 \quad (17)$$

Therefore, when the signal processing controller 319 performs an addition of $\Delta\phi x$ and $\Delta\phi xz$, the following equation (18) is obtained:

$$\phi\Delta x + \Delta\phi xz = 2\pi \cdot \Delta Z \cdot (\cos\theta_3 - \cos\theta_1/\lambda_1) \quad (18)$$

Thus, the phase difference signal which has a cycle of $\lambda_1/(\cos\theta_3 - \cos\theta_1)$ and corresponds to the gap $\Delta Z$ can be obtained. Therefore, when the mask stage 321 or the wafer stage 322 is moved along the direction $C_1$—$C_1'$ (or $C_2$—$C_2'$) so as to set the phase difference signal at a predetermined value, the phase difference can be set corresponding to the predetermined $\Delta Z$.

As described above, according to this embodiment, since the first and second diffraction gratings provided for the first and second objects are offset from each other along the grating line direction so as not to overlap with each other, the first and second optical heterodyne interference diffracted beams obtained from the first diffraction grating and the third and fourth optical heterodyne interference diffracted beams obtained from the second diffraction grating can be detected completely independently. In addition, by detecting a phase difference between the beat signals of the first and third optical heterodyne interference diffracted beams and a phase difference between the beat signals of the second and fourth optical heterodyne interference diffracted beams, the relative deviation between the first and second objects and a phase difference corresponding to the gap can be directly and stably detected. As a result, precise alignment can be stably performed by setting the phase difference to be 0°, and precise gap setting can be stably performed by setting the phase difference to be a predetermined value. Therefore, one of the two objects need not be set at a reference position prior to alignment or gap setting, so that degradation of alignment precision and gap setting precision, which is caused by setting errors, can be prevented. Furthermore, since an independent optical system is not necessary for the above setting operation, an apparatus can be simply arranged.

Especially when both the diffraction gratings are arranged in the same beam spot range of the incident beams and the same beams are incident thereon, optical path lengths of the incident beams incident on the respective diffraction gratings need not be set equal to each other, thereby extremely easily performing alignment and gap setting.

In addition, especially as for gap detection, since the diffraction grating can be arranged near a region where the gap is to be detected, e.g., an exposure region of an LSI pattern and the like, and even if flatness of a wafer or a mask (first or second object) is poor, a gap between the mask and the wafer in the exposure region can be precisely detected and set.

It is a matter of course that the present invention is not limited to the above embodiments, but various changes and modifications may be made within the spirit and scope of the invention. For example, a pair of diffraction gratings are used in each embodiment described above. However, similar diffraction gratings may be arranged at two or more positions on the mask and the wafer, beat signals of diffracted beams may be detected using a method similar to that shown in FIG. 11, and a mask stage and a wafer stage may be controlled so as to cancel the phase difference, so that the mask and the wafer can be aligned with respect to three axes, i.e., X- and Y-axes on a plane parallel to the diffraction grating surface and along directions respectively parallel and perpendicular to the diffraction grating and a rotating axis $\theta$ of the X-Y plane about the Z-axis perpendicular to the X-Y plane. In addition, alignment can be performed with respect to six axes, i.e., rotating axes $\alpha$ and $\beta$ respectively of the Y-Z and the X-Z planes about the X- and Y-axes in addition to the above three axes.

The first and second diffraction gratings may comprise absorbing or phase diffraction gratings are not limited to binary diffraction grantings as in the above embodiments. Various combinations such as sinusoidal diffraction gratings and blazed diffraction gratings may also be utilized.

In each of the embodiments shown in FIGS. 1 and 13, an opening is formed in a mask substrate as a monochromatic beam incident/diffracted beam extracting window. However, a transparent window capable of transmitting an incident beam and a diffracted beam may be used instead of the opening so as to obtain the same effect. In addition, in each of the above two embodiments, a prism-like mirror is used to split two heterodyne interference diffracted beams, but the heterodyne interference diffracted beams may be directly detected by the two-split detector to obtain the same effect.

In addition, in each of the embodiments shown in FIGS. 1 and 13, the first and second diffraction gratings are offset from each other along the grating line direction. However, when the first and second diffraction gratings are offset from each other along a direction (grating pitch direction) perpendicular to the grating line direction or along both the grating line and grating pitch directions, the same effect as in the above embodiments can be obtained.

Furthermore, in each of the embodiments shown in FIGS. 1 and 13, the first and second diffraction gratings are arranged in the same elliptic beam spot range of the incident beam. However, when the two monochromatic beams are incident independently on the first and second diffraction gratings, the same effect can be obtained if a phase difference caused by an optical path length difference between the respective two monochromatic beams incident on the first and second diffraction gratings is taken into consideration.

Moreover, in each of the embodiments shown in FIGS. 1 and 13, grating pitches of the first and second diffraction gratings are set equal to each other and optical heterodyne interference beams of the diffracted beams of the 1st order are used. However, the same effect can be generally obtained by using optical heterodyne interference beams of the nth diffracted beam (n is a positive integer). In addition, the grating pitches of the first and second diffraction gratings may be set different from each other so as to set the nth diffraction angle of the first diffraction grating equal to the mth diffraction grating angle (m is a positive integer) of the second diffraction grating, and an optical heterodyne interference beam of the nth diffracted beam from the first diffraction grating and an optical heterodyne interference beam of the mth diffracted beam from the second diffraction grating may be used to obtain the same effect.

Note that in each of the above embodiments, a two-wave orthogonally polarized laser source is used as a two-wave monochromatic beam source, but a beam generated by an acoustooptical element such as a Bragg cell may be used as a monochromatic beam to obtain the same effect.

In addition, in each of the above embodiments, a linear polarizer may be omitted, and a halfwave plate may be arranged into an optical path system of either of the two monochromatic beams so that directions of plane of polarization of the two monochromatic beams coincide with each other on the diffraction grating surface, thereby obtaining an optical heterodyne interference signals with a good coherent property and the same effect as in the above embodiments.

In each of the embodiments shown in FIGS. 13, 4, and 5, a direction of a diffracted beam from a diffraction grating is perpendicular to a grating surface, and in the embodiment shown in FIG. 7, a direction of an incident beam to a diffraction grating is perpendicular to a grating surface. However, a monochromatic beam may be obliquely incident on a diffraction grating and a diffracted beam obliquely reflected from the diffraction grating may be optically synthesized to detect an optical heterodyne interference beat signal, thereby obtaining the same effect.

In each of the embodiments shown in FIGS. 8 and 12, a direction of an incident beam to a diffraction grating and a direction of a diffracted beam from the diffraction grating are present in a plane including a Z direction perpendicular to a diffraction grating surface and a grating line direction. However, a monochromatic beam may be incident along a direction having a predetermined angle with respect to a plane including the Z direction and perpendicular to the grating line direction, and a diffracted beam may be detected along the direction having the predetermined angle and optically synthesized to generate an optical heterodyne interference beat signal, thereby obtaining the same effect as in the embodiments of FIGS. 8 and 12.

The first and second diffraction gratings may comprise absorbing or phase diffraction gratings are not limited to binary diffraction grantings as in the above embodiments. Various combinations such as sinusoidal diffraction gratings and blazed diffraction gratings may also be utilized. Furthermore, transmission diffraction gratings may also be utilized in addition to the reflecting diffraction gratings.

In addition, in each of the embodiments shown in FIGS. 8 and 12, 1st diffracted beams of two laser beams each having different frequencies are converted into synthetic diffracted beams along two directions. However, a synthetic diffracted beam of diffracted beams of higher orders or diffracted beams of different orders may be used to obtain two synthetic diffracted beams. In this case, only a cycle of a phase difference signal is changed, and displacements along X and Z directions can be detected by performing detection signal processing corresponding to a phase difference signal, thereby obtaining the same effect as in the embodiments of FIGS. 8 and 12.

Note that in each of the embodiments shown in FIGS. 8 and 12, when two diffraction gratings are arranged on objects so that their grating line directions are orthogonal to each other, micro-displacement can be measured with high precision with respect to X-, Y-, and Z-axes orthogonal to each other. In addition, micro-displacements along two directions of the diffraction grating, i.e., micro-displacement along a direction perpendicular to a grating line of the diffraction grating and micro-displacement along a normal direction of the diffraction grating can be measured respectively as phase shifts of the first and second optical heterodyne interference beat signals. Furthermore, when the intensity of a diffracted beam varies due to variations in intensity of a laser source or variations in diffraction efficiency of the diffraction grating, only an amplitude of a beat signal of the diffracted beam varies but the phase shifts are not adversely affected, thereby detecting the phase difference with high stability and high precision. Therefore, micro-displacements along two directions of the objects can be measured with high precision.

In addition, the micro-displacement measuring/adjusting apparatus according to the present invention can be compact and simple by arranging integrally detection optical systems and hence can be effectively used to carry out the above method.

In the embodiment shown in FIG. 13, an incident direction of a monochromatic beam incident on a diffraction grating to detect a deviation is set to be a direction corresponding to ±1st diffracted beams symmetrical with respect to a normal direction of a grating surface. However, the incident direction may be set to be a direction (angle $\theta_{\pm n}$) corresponding to ±nth diffracted beams (n is a natural number). In this case, equation (1) is represented by the following equation (19):

$$\Delta\phi x = 2\pi \cdot \Delta X/\{P/(2n)\} \qquad (19)$$

Similar to the above-mentioned case, by arranging the first and second diffraction gratings in the same spot range of a monochromatic beams, a phase shift of a diffracted beam, which is caused by changes in an optical path length of an optical system of the monochromatic beam to the diffraction grating, appears as the same phase shift in beat signals obtained by the first and second diffraction gratings. Therefore, the phase shifts are cancelled with each other, resulting in no influence of the phase shift. Therefore, optical path lengths of two beams need not be set with high precision, so that an optical system can be easily adjusted and a simple mechanical system can be used. In addition, a phase shift caused by changes in an optical path length due to micro-vibrations and the like of, e.g., optical components can be cancelled, so that a phase difference signal can be extracted with high precision.

In this case, one of incident directions of the respective monochromatic beams incident onto diffraction gratings is set to be a direction (angle $\theta_{3n}$) corresponding to the 3nth diffracted beam, and the other is set to be a direction (angle $\theta_n$) corresponding to the nth diffracted beam, with respect to a normal direction of a grating surface. Then, diffracted beams obtained by optical heterodyne interference are detected and a phase difference signal of the beat signals is generated. At this time, the phase difference between the beat signals is represented by the following equation (20):

$$\Delta\phi xz = 2\pi \cdot (-\Delta x)/\{P/(2n)\} + 2\pi \cdot \Delta Z \cdot \{(\cos\theta_{3n} - \cos\theta_n)/\lambda_1\} \qquad (20)$$

Therefore, similar to the above-mentioned case, by performing addition processing with respect to the phase difference signals for deviations represented by equation (19), a gap detection signal can be extracted independently of the deviation detection signal.

Furthermore, when an optical heterodyne interference diffracted beam obtained by synthesizing the $m_1$th diffracted beam and the $n_1$th diffracted beam is used to detect a deviation, equations (16) and (19) can be rewritten by the following equation (21). Note that an extraction direction of the synthetic beam need not be an upper direction:

$$\Delta\phi x = 2\pi \cdot \Delta X/\{P/(m_1 + n_1)\} \qquad (21)$$

Similarly, when an optical heterodyne interference diffracted beam obtained by synthesizing the $m_2$th diffracted beam and the $n_2$th diffracted beam is used to detect a gap, equations (17) and (20) are generally represented by the following equation (22), assuming that directions of incident beams are respectively $\theta_M$ and $\theta_N$. Also in this case, an extraction direction of the synthetic beam need not be an upper direction:

$$\Delta\phi xz = -2\pi \cdot \Delta X/\{P/(m_2 + n_2)\} + 2\pi \cdot \Delta Z \cdot \}(\cos\theta_M - \cos\theta_N)/\lambda_1\} \qquad (22)$$

Therefore, by adding $\Delta\phi x$ with $\Delta\phi xz$ after predetermined weighting, the gap detection signal can be extracted independently of the deviation detection signal.

In addition, in order to obtain two monochromatic beams each having slightly different frequencies, a two-wave orthogonally polarized laser source 1 is used, and a laser beam is split into the respective monochromatic components by a polarization beam splitter 3. However, it is a matter of course that two independent laser sources each generating one of the respective monochromatic beams may be used.

What is claimed is:

1. A method of detecting and adjusting a relative displacement of first and second objects using diffraction gratings, comprising:

generating at least two beat signals by synthesizing at least a set of two-wavelength monochromatic beams having slightly different frequencies so as to cause optical heterodyne interference, one of the beat signals being used as a first interference beat signal generated by emitting the two-wavelength monochromatic beams onto a first diffraction grating arranged on a first object and by synthesizing two diffracted beams having different wavelengths that are generated by said first diffraction grating upon emission of the two-wavelength monochromatic beams to cause the optical heterodyne interference, the other one of the beat signals being used as a second interference beat signal generated by emitting the two-wavelength monochromatic beams onto a second diffraction grating arranged on a second object and by synthesizing two diffracted beams having different wavelengths that are generated by said second diffraction grating upon emission of the two-wavelength monochromatic beams to cuase the optical heterodyne interference, wherein one of the first and second interference beat signals is used as a reference beat signal;

detecting a relative position of the first and second objects from a phase difference between the first and second interference beat signals; and setting and controlling the relative position to be a predetermined value.

2. A method according to claim 1, wherein said first and second diffraction gratings formed on said first and second objects are arranged within the same beam spots of the two-wavelength monochromatic beams emitted onto said first and second diffraction gratings.

3. A method according to claim 1, wherein the respective monochromatic beams used for generating the first and second interference beat signals are generated by a single light source.

4. A method according to claim 1, wherein the first and second interference beat signals are obtained by splitting the two-wavelength monochromatic beams.

5. A method according to claim 1, wherein the two-wavelength monochromatic beams emitted onto said first and second diffraction gratings formed on said first and second objects, respectively, are incident on said first and second diffraction gratings along two directions symmetrical to each other with respect to a normal to each of said first and second diffraction gratings so that the two-wavelength monochromatic beams are diffracted along directions that are normal to surfaces of said first and second diffraction gratings to obtain optical heterodyne interference beams.

6. A method according to claim 1, wherein:

the beat signals comprise four beat signals and include a third interference beat signal from said first diffraction grating and a fourth interference beat signal from said second diffraction grating in addition to the first and second interference beat signals, the third and fourth interference beat signals being generated by splitting the two-wavelength monochromatic beams incident on said first and second diffraction gratings, emitting two wavelength split monochromatic beams having different wavelengths onto said first and second diffraction gratings along directions different from those of the beams that are incident on said first and second diffraction gratings to generate the first and second interference beat signals, and by synthesizing obtained diffracted beams to cause the optical heterodyne interference, thereby generating the third and fourth interference beat signals by said first and second diffraction gratings, respectively, and a gap between said first and second objects is measured in accordance with a phase difference between the first and second interference beat signals and a phase difference between the third and fourth interference beat signals, thereby setting and controlling the gap to be a predetermined value.

7. A method according to claim 6, wherein, the third and fourth interference beat signals are obtained such that one of the two-wavelength monochromatic beams respectively incident on said first and second diffraction gratings is split, the split monochromatic beam is incident at a direction different from those of the two-wavelength monochromatic beams respectively incident on said first and second diffraction gratings for generating the first and second diffraction gratings, and the third and fourth interference beat signals are detected by optical heterodyne interference beams of the diffracted beams from said first and second diffraction gratings, which are obtained by the optical heterodyne interference of said one two-wavelength monochromatic beam and the other two-wavelength monochromatic beam which is not split.

8. A method according to claim 6, wherein the relative displacement between said first and second objects is measured in accordance with a selected one of a phase difference between the first and second interference beat signals, and a phase difference between the third and fourth interference beat signals, thereby setting and controlling the phase difference to be a predetermined value.

9. A method according to claim 6, wherein the two-wavelength monochromatic beams are synthesized to cause the optical heterodyne interference, thus generating the reference beat signal, and displacements along two directions of said first object are measured in accordance with a selected one of a phase difference between the reference beat signal and the first interference beat signal, thereby setting and controlling the displacements of said first object to be predetermined values, a phase difference between the reference beat signal and the third interference beat signal, and displacements along two directions of said second object are measured in accordance with a selected one of a phase difference between the reference beat signal and the second interference beat signal, and a phase difference between the reference beat signal and the fourth interference beat signal, thereby setting and controlling the displacements of said second object to be predetermined values.

10. A method according to claim 1, wherein said diffraction gratings are reflecting diffraction gratings.

11. An apparatus for detecting and adjusting a relative displacement of first and second objects using diffraction gratings, comprising:

a first diffraction grating arranged on a first object;

a second diffraction grating arranged on a second object;

a light source for generating two-wavelength monochromatic beams having slightly different frequencies;

first emitting means for emitting the two-wavelength monochromatic beams on said first diffraction grating;

second emitting means for emitting the two-wavelength monochromatic beams on said second diffraction grating;

means for synthesizing at least two diffracted beams obtained from said first diffraction grating and for generating a first interference beat signal by optical heterodyne interference;

means for synthesizing at least two diffracted beams obtained from said second diffraction grating and for generating a second interference beat signal by the optical heterodyne interference; and means for detecting a phase difference between the first and second interference beat signals and for setting and controlling the phase difference to be a predetermined value.

12. An apparatus according to claim 11, wherein said first and second emitting means comprise a common integral optical system, said first and second diffraction gratings formed on said first and second objects, respectively, are arranged within beam spots of corresponding beams emitted by said common integral optical system, and the diffracted beams obtained by said diffraction ratings are splitted and detected.

13. An apparatus according to claim 11, wherein a window is formed in said first object to transmit beams therethrough onto said second object.

14. An apparatus according to claim 11, wherein said first and second diffraction gatings have the same diffraction rating patterns but are arranged so as not to overlap each other when viewed from the top.

15. An apparatus according to claim 11, wherein said first and second diffraction gratings are reflecting diffraction ratings.

16. An apparatus according to claim 11, wherein the monochromatic beams used for generating the first interference beat signal and the monochromatic beams used for generating the second interference beat signal are the same as the monochromatic beams emitted by said light source.

17. An apparatus according to claim 11, wherein:

said first or second emitting means for emitting the two-wavelength monochromatic beams onto said first or second diffraction ratings, resectively, comprises:

means for splitting the two-wavelength monochromatic beams in different directions in accordance with a difference in wavelength; and means for emitting diffracted split beams having different wavelengths onto said first or second diffraction grating in two directions symmetric to each other with respect to the diffracted beams so that the incident beams are diffracted in a direction normal to the grating surface of said first or second diffraction grating.

18. An apparatus according to claim 11, comprising:

means for splitting the two-wavelength monochromatic beams;

third emitting means, in addition to said first and second emitting means, for emitting the two-wavelength monochromatic beams onto said first diffracting beams;

fourth emitting means for emitting the two-wavelength monochromatic beams onto said second diffraction rating;

means for synthesizing at least two diffracted beams obtained from said first diffraction grating upon emission by said third and fourth emitting means and for generating a third interference beat signal by optical heterodyne interference;

means for synthesizing at leas two diffracted beams obtained from said second diffraction grating and for generating a fourth interference signal by the optical heterodyne interference; and means for detecting a phase difference between the first and second interference beat signals and a phase difference between the third and fourth interference beat signals, wherein a gap between said first and second objects is measured and said phase difference is set and controlled to be a predetermined value.

19. An apparatus according to claim 18, wherein:

said first and second emitting means constitute a common integral optical system, said third and fourth emitting means constitute a common integral optical system, said first and second diffraction gratings formed on said first and second objects, respectively, are arranged within beam spots of corresponding beams emitted by said common integral optical systems, and the diffracted beams obtained by said first and second diffraction gratings are split and detected.

20. An apparatus according to claim 18, comprising:

means for synthesizing the two-wavelength monochromatic beams and for generating a reference beat signal by the optical heterodyne interference; and means for measuring a selected one of a phase difference between the reference beat signal and the first interference beat signal and a phase difference between the reference beat signal and the third interference beat signal, and a phase difference between the reference beat signal and the second interference beat signal and a phase difference between the reference beat signal and the fourth interference beat signal and for setting and controlling the phase differences to be predetermined values;

wherein displacements along two directions of said first or second object are measured and are set and controlled to be predetermined values.

* * * * *

UNITED STATES PATENT AND TRADEMARK OFFICE
CERTIFICATE OF CORRECTION

PATENT NO. : 5,000,573
DATED : March 19, 1991
INVENTOR(S) : Suzuki, et. al.

It is certified that error appears in the above-indentified patent and that said Letters Patent is hereby corrected as shown below:

Col. 4, line 22, change "$<^*$" to --21ʺ--;

line 37, change "polarizes" to --polarizers--;

Col. 5, line 25, change "$\theta_{-1}=\theta_{+1}$" to --$\theta_{-1}\cong\theta_{+1}$--;

line 34, change "440" to --40--;

line 41, change "directios" to --directions--;

line 42, change "lenghts" to --lengths--;

line 53, change "$A_2'A_2'$" to --$A_2$-$A_2'$--;

line 60, change "directions" to --direction--;

Col. 7, line 18, change "beams to --beam--;

line 21, change "beams" (first occurrence) to --beam--;

line 23, change "throught" to --through--;

UNITED STATES PATENT AND TRADEMARK OFFICE
CERTIFICATE OF CORRECTION

PATENT NO. : 5,000,573
DATED :
INVENTOR(S) :

It is certified that error appears in the above-indentified patent and that said Letters Patent is hereby corrected as shown below:

Col. 12, line 14, change "$\theta n_1 \approx \theta n_2$" to --$\theta n_1 \doteq \theta n_2$--;

line 14 change "$3\theta n_2 \approx 3$" to --$3\theta n_2 \doteq 3$-- line 19, change "$\approx 2\pi$" to --$\doteq 2\pi$-- line 63, change "$\lambda_1 \approx \lambda_2$" to --$\lambda_1 \doteq \lambda_2$--

Col. 23, line 21, change "cuase" to --cause--;

Col. 25, line 45, change "resectively" to --respectively--.

Signed and Sealed this

Thirtieth Day of May, 1995

Attest:

BRUCE LEHMAN

*Attesting Officer*     *Commissioner of Patents and Trademarks*